United States Patent
Seo et al.

(10) Patent No.: US 9,571,076 B2
(45) Date of Patent: Feb. 14, 2017

(54) BIDIRECTIONAL DELAY CIRCUIT AND INTEGRATED CIRCUIT INCLUDING THE SAME

(71) Applicants: Jae-Woo Seo, Seoul (KR); Sung-Hyun Park, Suwon-Si (KR); Woo-Jin Rim, Suwon-Si (KR); Ha-Young Kim, Seoul (KR); Jae-Ha Lee, Hwasung (KR); Yong-Ho Kim, Seoul (KR)

(72) Inventors: Jae-Woo Seo, Seoul (KR); Sung-Hyun Park, Suwon-Si (KR); Woo-Jin Rim, Suwon-Si (KR); Ha-Young Kim, Seoul (KR); Jae-Ha Lee, Hwasung (KR); Yong-Ho Kim, Seoul (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 0 days.

(21) Appl. No.: 14/877,258

(22) Filed: Oct. 7, 2015

(65) Prior Publication Data
US 2016/0105166 A1    Apr. 14, 2016

Related U.S. Application Data

(60) Provisional application No. 62/063,427, filed on Oct. 14, 2014.

(30) Foreign Application Priority Data

Aug. 27, 2015  (KR) .................. 10-2015-0120655

(51) Int. Cl.
*H03K 17/284* (2006.01)
*H03K 5/12* (2006.01)
*H03K 17/687* (2006.01)

(52) U.S. Cl.
CPC .............. *H03K 5/12* (2013.01); *H03K 17/687* (2013.01)

(58) Field of Classification Search
None
See application file for complete search history.

(56) References Cited

U.S. PATENT DOCUMENTS 5,278,522 A * 1/1994 Atriss .................. H03K 3/0315
                                                    327/269
5,434,525 A * 7/1995 Leonowich ............ H03K 3/354
                                                    327/278
(Continued)

FOREIGN PATENT DOCUMENTS

JP      5191232 B    7/1993
KR      1005156 B1   10/1998
(Continued)

*Primary Examiner* — Cassandra Cox
(74) *Attorney, Agent, or Firm* — Volentine & Whitt, PLLC

(57) ABSTRACT

A bidirectional delay circuit includes an input driving circuit and a delay switch circuit. The input driving circuit is connected between an input node and an intermediate node, and the input driving circuit amplifies an input signal received through the input node to generate an intermediate signal through the intermediate node. The delay switch circuit is connected between the intermediate node and a delay node, and the delay switch circuit delays both of rising edges and falling edges of the intermediate signal in response to a gate signal to generate a delay signal through the delay node. The gate signal may transition in response to the input signal.

20 Claims, 28 Drawing Sheets

(56) References Cited

U.S. PATENT DOCUMENTS

| | | | |
|---|---|---|---|
| 5,872,477 A * | 2/1999 | Price, Jr. | H04J 3/047 |
| | | | 327/392 |
| 6,172,545 B1 | 1/2001 | Ishii | |
| 7,064,594 B2 | 6/2006 | Kim | |
| 7,212,031 B2 | 5/2007 | Yamamoto | |
| 8,278,983 B2 | 10/2012 | Okada | |
| 8,390,329 B1 * | 3/2013 | Sridhara | H03K 5/133 |
| | | | 326/26 |
| 2005/0088219 A1 * | 4/2005 | Kim | H03K 17/302 |
| | | | 327/399 |
| 2007/0013421 A1 * | 1/2007 | Wang | G06F 1/10 |
| | | | 327/161 |
| 2008/0204103 A1 * | 8/2008 | Jung | G06F 1/10 |
| | | | 327/288 |
| 2009/0167399 A1 * | 7/2009 | Lu | H03H 11/26 |
| | | | 327/281 |
| 2010/0039157 A1 * | 2/2010 | Kaeriyama | G06F 1/08 |
| | | | 327/292 |

FOREIGN PATENT DOCUMENTS

| | | |
|---|---|---|
| KR | 0304970 B | 7/2001 |
| KR | 0400306 B | 9/2003 |
| KR | 0171056 B | 12/2010 |

* cited by examiner

BIDIRECTIONAL DELAY CIRCUIT AND INTEGRATED CIRCUIT INCLUDING THE SAME

CROSS-REFERENCE TO RELATED APPLICATION

A claim of priority under 35 USC §119 is made to U.S. Provisional Application No. 62/063,427, filed on Oct. 14, 2014, in the U.S. Patent and Trademark Office, and to Korean Patent Application No. 10-2015-0120655, filed on Aug. 27, 2015 in the Korean Intellectual Property Office (KIPO), the disclosures of which are incorporated herein by reference in their entireties.

BACKGROUND

Example embodiments relate generally to semiconductor integrated circuits, and more particularly to bidirectional delay circuits and to integrated circuits including bidirectional delay circuits.

The demand for efficient design of semiconductor integrated circuits increases with performance enhancements and higher degrees of integration. Typically, in a semiconductor integrated circuit, a complementary metal oxide semiconductor (CMOS) inverter chain is used to achieve a relatively short signal delay time, and a resister-capacitor (RC) delay circuit is used to achieve a relatively long signal delay time. However, the delay time of the RC delay circuit is influenced by variations in manufacturing processes and temperature, which makes it is difficult to implement an exact delay time. Also, the RC delay circuit exhibits low efficiency in terms of chip size.

In addition, the on-current of a transistor increases as the manufacturing process is scaled down, and the increased on-current has an negative effect on a delay circuit for realizing a long delay time. As the integration degree of the semiconductor integrated circuit increases, loads of signal lines increase, and thus the longer delay time may be required. For example, in case of a semiconductor memory device, loads of word lines and bit lines increase according to an increase of its memory capacity, and the larger pulse width or the longer delay time may be required read and write operational margin. The size of the delay circuit increases as the required delay time increases, which results in an increase of an entire size of the integrated circuit and limits a design margin.

SUMMARY

Some example embodiments of the present disclosure may provide a bidirectional delay circuit capable of generating a delay signal efficiently.

Some example embodiments of the present disclosure may provide an integrated circuit including a bidirectional delay circuit capable of generating a delay signal efficiently.

According to example embodiments, a bidirectional delay circuit may include an input driving circuit and a delay switch circuit. The input driving circuit may be connected between an input node and an intermediate node, and the input driving circuit may amplify an input signal received through the input node to generate an intermediate signal through the intermediate node. The delay switch circuit may be connected between the intermediate node and a delay node, and the delay switch circuit may delay both of rising edges and falling edges of the intermediate signal in response to a gate signal to generate a delay signal through the delay node. The gate signal may transition in response to the input signal.

In some example embodiments, the delay switch circuit may include a P-type transistor connected between the intermediate node and the delay node, and an N-type transistor connected between the intermediate node and the delay node. The P-type transistor may include a P-type gate electrode receiving the gate signal, and the N-type transistor may include an N-type gate electrode receiving the gate signal.

In some example embodiments, in response to a logic level of the gate signal, one of the P-type transistor and the N-type transistor may be turned on selectively, and the other of the P-type transistor and the N-type transistor may be turned off.

In some example embodiments, the P-type gate electrode and the N-type gate electrode may be electrically connected to the input node through a conduction path.

In some example embodiments, the conduction path may include a gate poly that is formed and patterned together with the P-type gate electrode and the N-type gate electrode.

In some example embodiments, the P-type gate electrode and the N-type gate electrode may be electrically connected to the intermediate node through a conduction path.

In some example embodiments, the input driver circuit may include one or more gate circuits that are connected in series between the input node and the intermediate node, and the delay switch circuit may include one or more transmission gates that are connected in series between the intermediate node and the delay node. Each transmission gate may include a P-type gate electrode and an N-type gate electrode receiving the gate signal.

In some example embodiments, the gate circuits may include at least one of an inverter, a buffer, an AND gate, an OR gate, a NAND gate, a NOR gate, an exclusive OR gate and an exclusive NOR gate.

In some example embodiments, with respect to at least one of the transmission gates, the P-type gate electrode and the N-type electrode may be electrically connected to the input node.

In some example embodiments, with respect to at least one of the transmission gates, the P-type gate electrode and the N-type electrode may be electrically connected to the intermediate node.

In some example embodiments, the bidirectional delay circuit may further include an output driving circuit connected between the delay node and an output node. The output circuit may amplify the delay signal to generate an output signal through the output node.

In some example embodiments, the bidirectional delay circuit may further include a gate signal generator configured to be powered by a first voltage and a second voltage lower than the first voltage, and configured to generate the gate signal transitioning between a first gate voltage and a second gate voltage. The first gate voltage is lower than the first voltage, and the second gate voltage is higher than the second voltage.

In some example embodiments, the gate signal generator may include a first voltage generator configured to generate the first gate voltage lower than the first voltage, a second voltage generator configured to generate the second gate voltage higher than the second voltage, and an output switch circuit configured to select one of the first gate voltage and the second gate voltage to output the gate signal.

In some example embodiments, the first voltage generator may include a first P-type transistor, a second P-type transistor, a first N-type transistor and a second N-type transistor sequentially connected in series between the first voltage to the second voltage. The second voltage may be applied to gate electrodes of the first P-type transistor and the second P-type transistor, and the first gate voltage may be provided through a connection node of the first P-type transistor and the second P-type transistor. The input signal may be applied to a gate electrode of the first N-type transistor, and an enable signal may be applied to a gate electrode of the second N-type transistor.

In some example embodiments, the second voltage generator may include a third N-type transistor, a fourth N-type transistor, a third P-type transistor and a fourth P-type transistor sequentially connected in series between the second voltage to the first voltage. The first voltage may be applied to gate electrodes of the third N-type transistor and the fourth N-type transistor, and the second gate voltage may be provided through a connection node of the third N-type transistor and the fourth N-type transistor. The input signal may be applied to a gate electrode of the third P-type transistor, and an inversion signal of the enable signal may be applied to a gate electrode of the fourth P-type transistor.

In some example embodiments, the output switch circuit may include a first output switch configured to provide the first gate voltage as a voltage level of the gate signal according to the input signal, and a second output switch configured to provide the second gate voltage as the voltage level of the gate signal according to the input signal.

According to example embodiments, an integrated circuit may include a plurality of bidirectional delay circuits that are cascade-coupled such that each of the plurality of bidirectional delay circuits receives a delay signal from the bidirectional delay circuit of a previous stage as an input signal. Each bidirectional delay circuit may include an input driving circuit and a delay switch circuit. The input driving circuit may be connected between an input node and an intermediate node, and the input driving circuit may amplify the input signal received through the input node to generate an intermediate signal through the intermediate node. The delay switch circuit may be connected between the intermediate node and a delay node, and the delay switch circuit may delay both of rising edges and falling edges of the intermediate signal in response to a gate signal to generate the delay signal through the delay node. The gate signal may transition in response to the input signal.

In some example embodiments, the delay switch circuit may include a P-type transistor connected between the intermediate node and the delay node, and an N-type transistor connected between the intermediate node and the delay node. The P-type transistor may include a P-type gate electrode receiving the gate signal, and the N-type transistor may include an N-type gate electrode receiving the gate signal.

In some example embodiments, the plurality of bidirectional delay circuits may include a first bidirectional delay circuit configured to delay a first input signal in response to a first gate signal to generate a first delay signal, and a second bidirectional delay circuit configured to receive the first delay signal as a second input signal and configured to delay the second input signal in response to a second gate signal to generate a second delay signal. The first bidirectional delay circuit may receive an inversion signal of the first input signal as the first gate signal, and the second bidirectional delay circuit may receive the second input signal as the second gate signal.

According to example embodiments, a bidirectional delay circuit may include an inverter and a transmission gate. The inverter may be connected between an input node and an intermediate node, and the inverter may invert and amplify an input signal received through the input node to generate an intermediate signal through the intermediate node. The transmission gate may be connected between the intermediate node and a delay node, and the transmission gate may delay both of rising edges and falling edges of the intermediate signal in response to a gate signal to generate a delay signal through the delay node. The gate signal may transition in response to the input signal.

The bidirectional delay circuit and the integrated circuit including the bidirectional delay circuit may delay both of the rising edges and the falling edges of the input signal using the gate signal transitioning in response to the input signal, thereby implementing a larger delay amount with a less circuit area.

BRIEF DESCRIPTION OF THE DRAWINGS

Example embodiments of the present disclosure will be more clearly understood from the following detailed description taken in conjunction with the accompanying drawings.

DETAILED DESCRIPTION OF THE EMBODIMENTS

Figure 1:
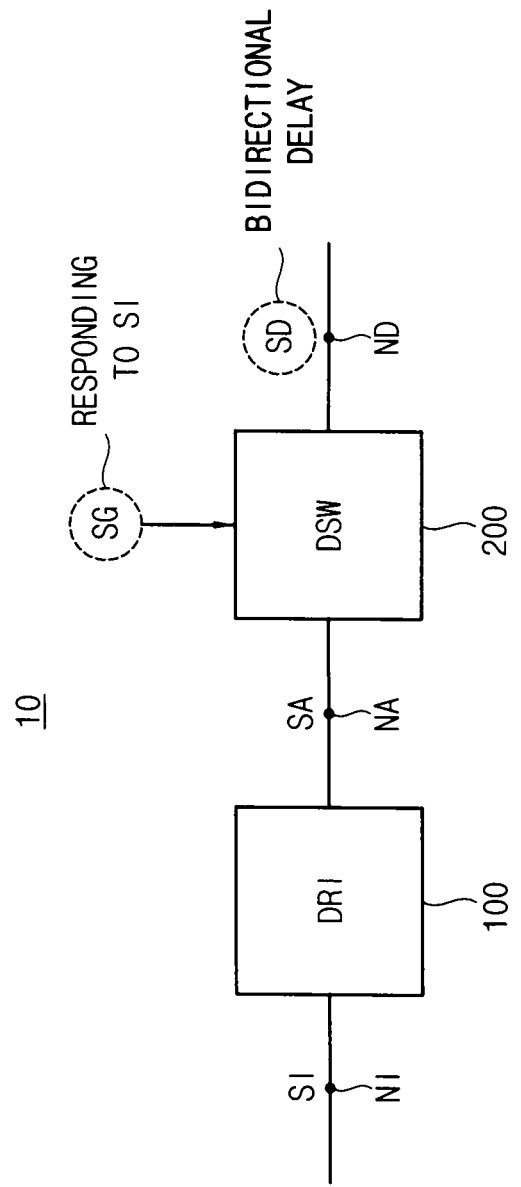
FIG. 1 is a block diagram illustrating a bidirectional delay circuit according to example embodiments.

Various example embodiments will be described more fully hereinafter with reference to the accompanying drawings, in which some example embodiments are shown. The present disclosure may, however, be embodied in many different forms and should not be construed as limited to the example embodiments set forth herein. Rather, these example embodiments are provided so that this disclosure will be thorough and complete, and will fully convey the scope of the present disclosure to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present disclosure. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
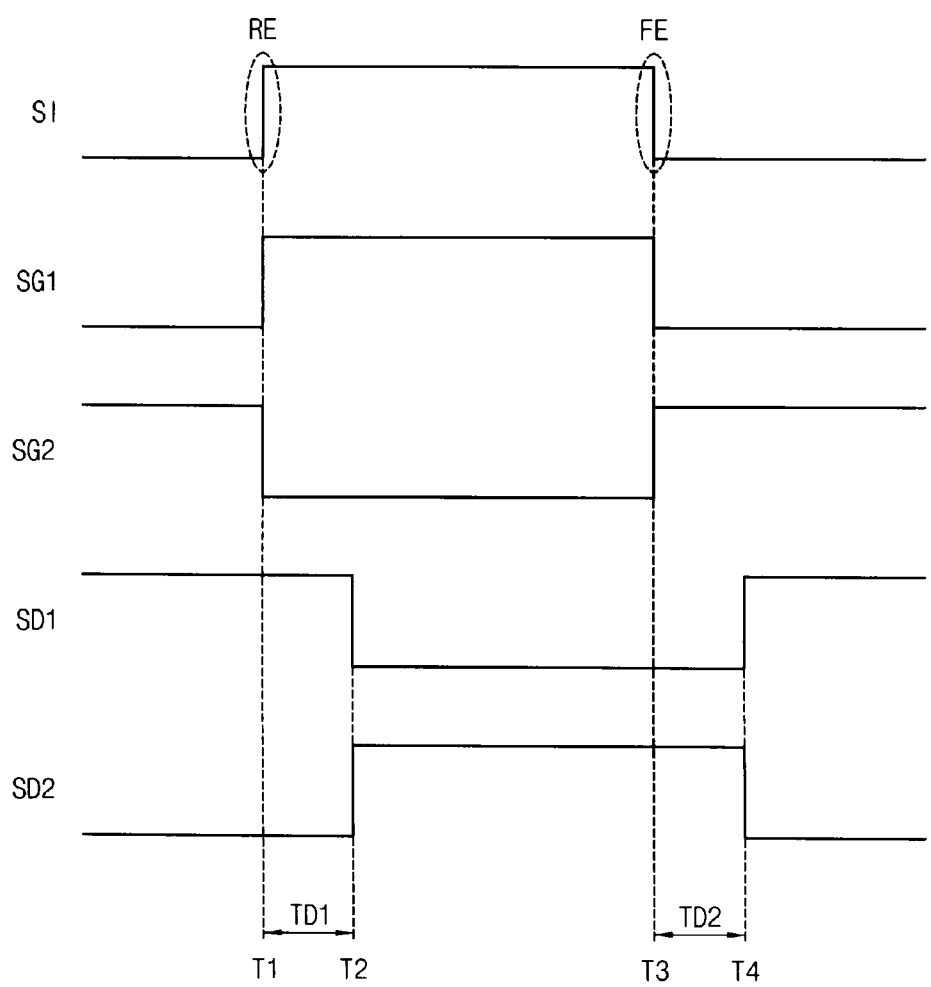
FIG. 2 is a timing diagram illustrating an operation of the bidirectional delay circuit of FIG. 1.

FIG. 1 is a block diagram illustrating a bidirectional delay circuit according to example embodiment, and FIG. 2 is a timing diagram illustrating an operation of the bidirectional delay circuit of FIG. 1.

Referring to FIG. 1, a bidirectional delay circuit 10 may include an input driving circuit DRI 100 and a delay switch circuit DSW 200.

The input driving circuit 100 is connected between an input node NI and an intermediate node NA. The input driving circuit 100 may amplify an input signal SI received through the input node NI to generate an intermediate signal SA through the intermediate node NA. The delay switch circuit 200 is connected between the intermediate node NA and a delay node ND. The delay switch circuit 200 may delay both of rising edges and falling edges of the intermediate signal 200 in response to a gate signal SG to generate a delay signal SD through the delay node ND. The gate signal SG may transition in response to the input signal SI.

According to example embodiments, the gate signal SG may be a signal that transitions in response to the input signal SI. As illustrated in FIG. 2, the input signal SI itself may be provided as the gate signal SG1 in some example embodiments, or the inversion signal of the input signal SI may be provided as the gate signal SG2 in other example embodiments.

In some example embodiments, the input driving circuit 100 may invert and amplify the input signal SI to generate the intermediate signal SA, and the delay signal SD1 may be inverted with respect to the input signal SI. In other words, the rising edge RE of the input signal SI at time T1 may correspond to the falling edge of the delay signal SD1 at time T2, and the falling edge FE of the input signal SI at time T3 may correspond to the rising edge of the delay signal SD1 at time T4.

In other example embodiments, the input driving circuit 100 may amplify the input signal SI without inversion to generate the intermediate signal SA, and the delay signal SD2 may not be inverted with respect to the input signal SI. In other words, the rising edge RE of the input signal SI at time T1 may correspond to the rising edge of the delay signal SD2 at time T2, and the falling edge FE of the input signal SI at time T3 may correspond to the falling edge of the delay signal SD2 at time T4.

Even though FIG. 2 shows that the transition timings of the input signal SI are equal to the transition timings of the gate signal SG, the gate signal SG may be delayed slightly with respect to the input signal SI. The voltage levels of the input signal SI may be equal to or different from the voltage levels of the gate signal SG. In some example embodiments, a width of the voltage levels or a swing width of the gate signal SG may be less than a swing width of the input signal SI.

According to example embodiments, the delay signal SD may have the bidirectional delay such that both of the rising edges RE and the falling edges FE of the intermediate signal SA are delayed. The intermediate signal SA is amplified from the input signal SI. Accordingly the delay signal SD may be generated by delaying the rising edges RE of the input signal SI with a first delay time tD1, and by delaying the falling edges FE of the input signal SI with a second delay time tD2.

As such, the bidirectional delay circuit 10 according to example embodiments may delay both of the rising edges RE and the falling edges FE of the input signal SI using the gate signal SG that transitions in response to the input signal SI, thereby implementing a larger delay amount with a less circuit area.

Figure 3:
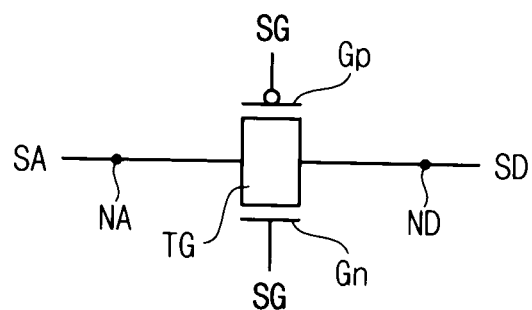
FIG. 3 is a diagram illustrating an example embodiment of the delay switch circuit included in the bidirectional delay circuit of FIG. 1.
Figure 4A:
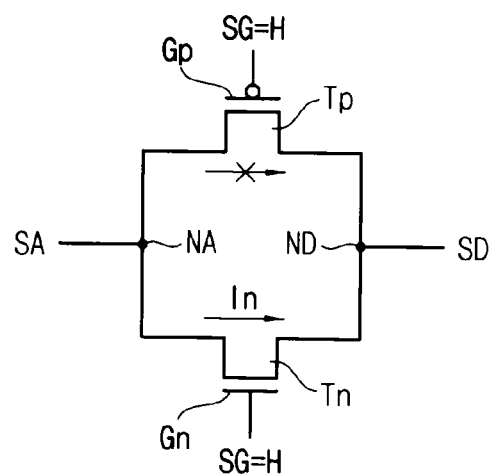
FIGS. 4A and 4B are diagrams for describing an operation of the delay switch circuit of FIG. 3.
Figure 4B:
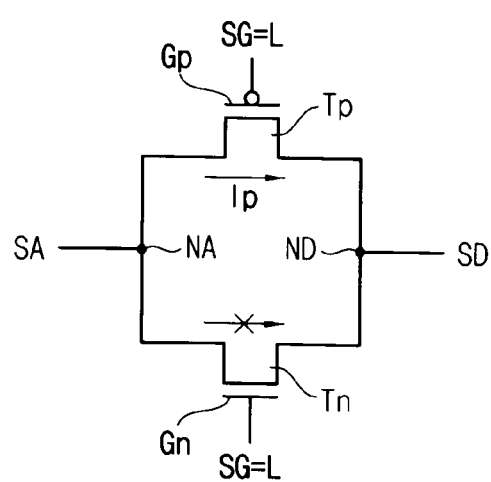

FIG. 3 is a diagram illustrating an example embodiment of the delay switch circuit included in the bidirectional delay circuit of FIG. 1, and FIGS. 4A and 4B are diagrams for describing an operation of the delay switch circuit of FIG. 3.

Referring to FIG. 3, a delay switch circuit 201 may include a transmission gate 201. The transmission gate TG may be connected between the intermediate node NA receiving the intermediate signal SA and the delay node ND outputting the delay signal SD. The transmission gate TG may include a P-type gate electrode Gp and an N-type gate electrode Gn receiving the gate signal SG. FIG. 3 illustrates a non-limiting example embodiment where one transmission gate TG is disposed between the intermediate node NA and the delay node ND, and two or more transmission gates may be connected in series between the intermediate node NA and the delay node ND.

The transmission gate TG of FIG. 3 is equivalent to a pair of transistors Tp and Tn of FIGS. 4A and 4B. In other words, the transmission gate TG may include a P-type transistor Tp and an N-type transistor Tn connected in parallel between the intermediate node NA and the delay node ND. The P-type transistor and the N-type transistor may be a P-type or P-channel metal oxide semiconductor (PMOS) transistor and an N-type or N-channel metal oxide semiconductor (NMOS) transistor that are formed at a semiconductor substrate. A gate electrode of the P-type transistor Tp may correspond to the P-type gate electrode of the transmission gate TG, and a gate electrode of the N-type transistor Tn may correspond to the N-type gate electrode of the transmission gate TG.

FIG. 4A illustrates a switching operation of the transistors Tp and Tn when the gate signal SG is in a logic high level H, and FIG. 4B illustrates the switching operation of the transistors Tp and Tn when the gate signal SG is in a logic low level L. When the gate signal SG is in the logic high level H, the P-type transistor Tp is turned off and the N-type transistor Tn is turned on so that an on-current In may flow through a channel formed at the N-type transistor Tn. In contrast, when the gate signal SG is in the logic low level L, the P-type transistor Tp is turned on and the N-type transistor Tn is turned off so that an on-current Ip may flow through a channel formed at the P-type transistor Tp. In response to the logic level of the gate signal SG, one of the P-type transistor Tp and the N-type transistor Tn may be turned on and the other may be turned off. Through such a switching operation, both of the rising edges RE and the falling edges FE of the input signal SI may be delayed to implement the bidirectional delay.

Figure 5:
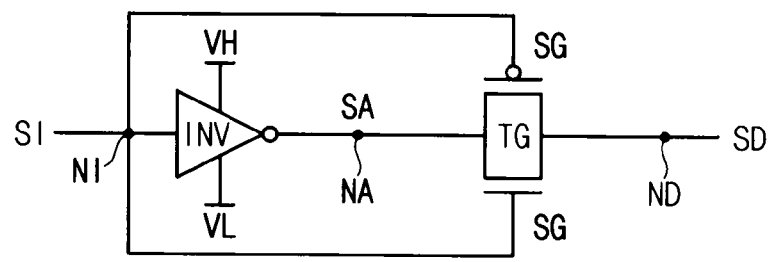
FIG. 5 is a diagram illustrating a bidirectional delay circuit according to an example embodiment.

FIG. 5 is a diagram illustrating a bidirectional delay circuit according to an example embodiment.

Referring to FIG. 5, a bidirectional delay circuit 11 may include an inverter INV and a transmission gate TG. The inverter INV may correspond to the above-mentioned input driving circuit, and the transmission gate TG may correspond to the above-mentioned delay switch circuit.

Figure 12A:
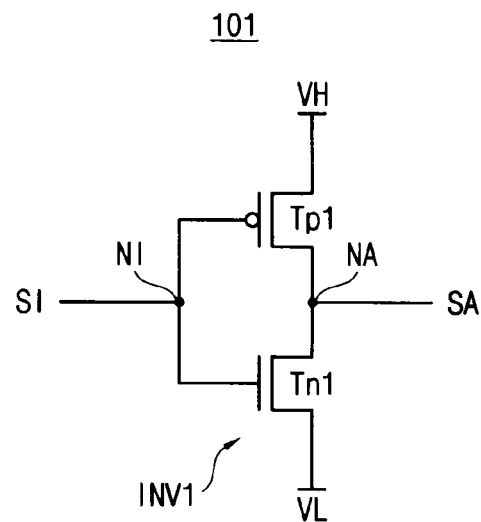
FIGS. 12A and 12B are diagrams illustrating example embodiments of an input driving circuit included in the bidirectional delay circuit of FIG. 1, which is implemented with single-stack inverters.

The inverter INV may include a P-type transistor Tp1 connected between a first voltage VH and an intermediate node NA, and an N-type transistor Tn1 connected between the intermediate node NA and a second voltage VL, as illustrated in FIG. 12A. Gate electrodes of the transistors Tp1 and Tn1 may be connected to an input node NI. The inverter INV may be connected between the input node NI and the intermediate node NA. The inverter INV may invert and amplify an input signal SI received through the input node NI to generate an intermediate signal SA through the intermediate node NA. The inverter INV may be powered by the first voltage VH and the second voltage VL lower than the first voltage VH. For example, the first voltage VH may be a power supply voltage VDD, and the second voltage VL may be a ground voltage VSS.

The transmission gate TG may be connected between the intermediate node NA and a delay node ND. The transmission gate TG may delay both of rising edges and falling edges of the intermediate signal SA in response to a gate signal SG to generate a delay signal SD through the delay node ND. The gate signal SG may transition in response to the input signal SI.

In some example embodiments, the gate electrodes of the transmission gate TG may be electrically connected to the input node NI through a conduction path as illustrated in FIG. 5. Hereinafter, an operation of the bidirectional delay circuit 11 of FIG. 5 is described with reference to FIGS. 6 and 7.

Figure 6:
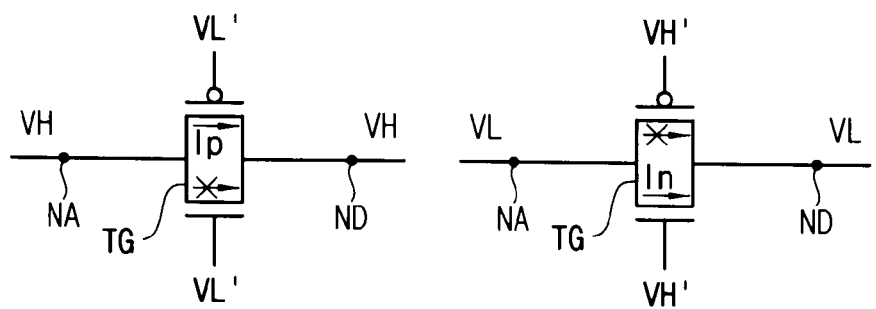
FIG. 6 is a diagram for describing an operation of the bidirectional delay circuit of FIG. 5.
Figure 7:
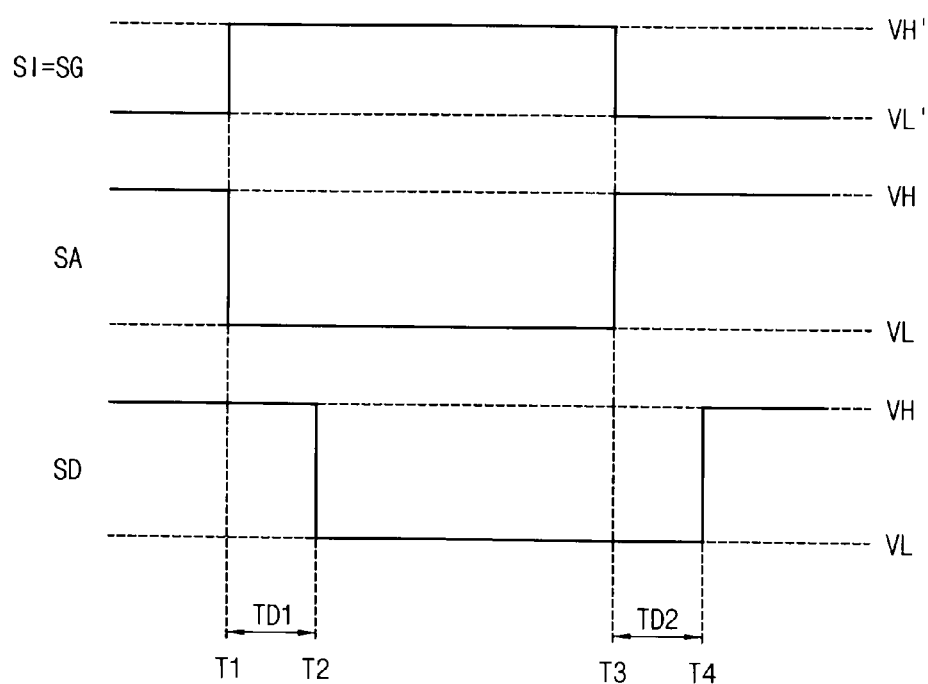
FIG. 7 is a timing diagram illustrating the operation of the bidirectional delay circuit of FIG. 5.

FIG. 6 is a diagram for describing an operation of the bidirectional delay circuit of FIG. 5, and FIG. 7 is a timing diagram illustrating the operation of the bidirectional delay circuit of FIG. 5.

Referring to FIGS. 6 and 7, the input signal SI may be provided as the gate signal SG because the gate electrodes of the transmission gate TG are electrically connected to the input node NI. The voltage levels VH' and VL' of the input signal SI and the gate signal SG may be equal to or different from the first voltage VH and the second voltage VL, respectively. The intermediate signal SA at the intermediate node NA may be inverted with respect to the input signal SI and the gate signal SG, and thus the delay signal SD at the delay node ND may be inverted with respect to the input signal SI and the gate signal SG.

At time T1, the input signal SI and the gate signal SG transition from the logic low level VL' to the logic high level VH'. Accordingly the P-channel of the transmission gate TG, that is, the channel of the P-type transistor is turned off, and the N-channel of the transmission gate TG, that is, the channel of the N-type transistor is turned on. Thus, the on-current In flows through the N-type transistor of the transmission gate TG. The delay node ND is discharged gradually by the on-current In, and the delay signal SD transitions from the first voltage VH to the second voltage VL at time T2 after a first delay time tD1.

At time T3, the input signal SI and the gate signal SG transition from the logic high level VH' to the logic low level VL'. Accordingly the P-channel of the transmission gate TG is turned on, and the N-channel of the transmission gate TG is turned off. Thus, the on-current Ip flows through the P-type transistor of the transmission gate TG. The delay node ND is charged gradually by the on-current Ip, and the delay signal SD transitions from the second voltage VL to the first voltage VH at time T4 after a second delay time tD2.

As such, since one of the P-type transistor and the N-type transistor of the transmission gate TG is turned on selectively and the other is turned off, the on-current In or Ip may be reduced in comparison with a case where both of the P-type transistor and the N-type transistor of the transmission gate TG are turned on. The charging time and the discharging time of the delay node ND may be reduced due to the decrease of the on-current, and thus the first delay time tD1 and the second delay time tD2 may be increased.

As illustrated in FIG. 6, the first voltage VH of the logic high level at the intermediate node NA may be transferred to the delay node ND through the P-type transistor of the transmission gate TG, and the second voltage VL of the logic low level at the intermediate node NA may be transferred to the delay node ND through the N-type transistor of the transmission gate TG. In general, the P-type transistor may cause voltage degradation when transferring the lower voltage, and the N-type transistor may cause the voltage degradation when transferring the higher voltage. The bidirectional delay circuit 11 of FIG. 5 may not cause the voltage degradation because the P-type transistor transfers the higher voltage VH, and the N-type transistor transfers the lower voltage VL. Accordingly, the voltage levels VH and VL of the delay signal SD may be equal to the voltage levels VH and VL of the intermediate signal SA as illustrated in FIG. 7.

Figure 8:
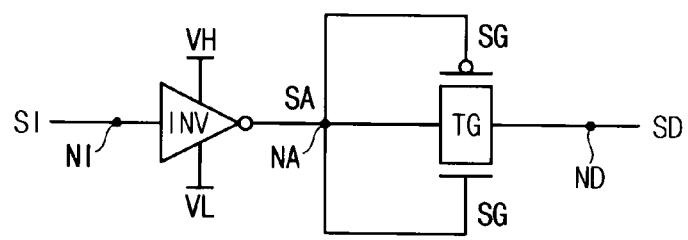
FIG. 8 is a diagram illustrating a bidirectional delay circuit according to an example embodiment.

FIG. 8 is a diagram illustrating a bidirectional delay circuit according to an example embodiment.

Referring to FIG. 8, a bidirectional delay circuit 12 may include an inverter INV and a transmission gate TG. The inverter INV may correspond to the above-mentioned input driving circuit, and the transmission gate TG may correspond to the above-mentioned delay switch circuit.

The inverter INV may include a P-type transistor Tp1 connected between a first voltage VH and an intermediate node NA, and an N-type transistor Tn1 connected between the intermediate node NA and a second voltage VL, as illustrated in FIG. 12A. Gate electrodes of the transistors Tp1 and Tn1 may be connected to an input node NI. The inverter INV may be connected between the input node NI and the intermediate node NA. The inverter INV may invert and amplify an input signal SI received through the input node NI to generate an intermediate signal SA through the intermediate node NA. The inverter INV may be powered by the first voltage VH and the second voltage VL lower than the first voltage VH. For example, the first voltage VH may be a power supply voltage VDD, and the second voltage VL may be a ground voltage VSS.

The transmission gate TG may be connected between the intermediate node NA and a delay node ND. The transmission gate TG may delay both of rising edges and falling edges of the intermediate signal SA in response to a gate signal SG to generate a delay signal SD through the delay node ND. The gate signal SG may transition in response to the input signal SI.

In some example embodiments, the gate electrodes of the transmission gate TG may be electrically connected to the intermediate node NI through a conduction path as illustrated in FIG. 8. Hereinafter, an operation of the bidirectional delay circuit 12 of FIG. 8 is described with reference to FIGS. 9 and 10.

Figure 9:
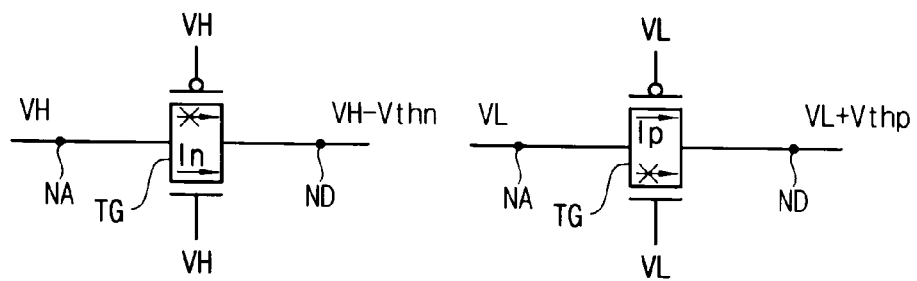
FIG. 9 is a diagram for describing an operation of the bidirectional delay circuit of FIG. 8.
Figure 10:
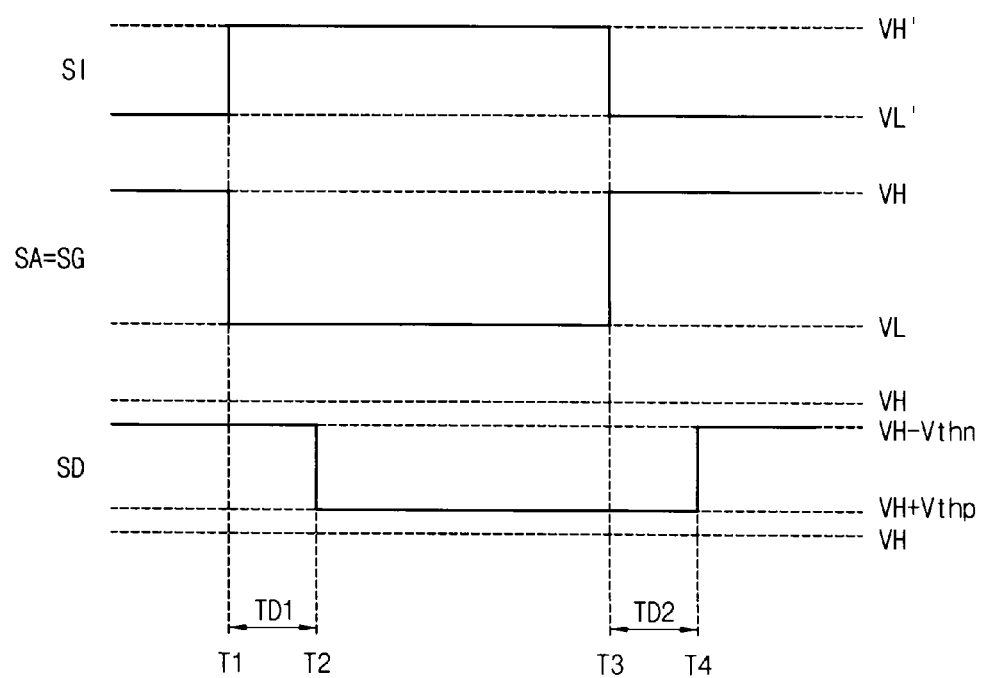
FIG. 10 is a timing diagram illustrating the operation of the bidirectional delay circuit of FIG. 8.

FIG. 9 is a diagram for describing an operation of the bidirectional delay circuit of FIG. 8, and FIG. 10 is a timing diagram illustrating the operation of the bidirectional delay circuit of FIG. 8.

Referring to FIGS. 9 and 10, the intermediate signal SA may be provided as the gate signal SG because the gate electrodes of the transmission gate TG are electrically connected to the intermediate node NA. The voltage levels VH' and VL' of the input signal SI may be equal to or different from the first voltage VH and the second voltage VL, respectively. The gate signal SG and the intermediate signal SA at the intermediate node NA may be inverted with respect to the input signal SI, and thus the delay signal SD at the delay node ND may be inverted with respect to the input signal SI.

At time T1, the input signal SI transitions from the logic low level VL' to the logic high level VH', and the gate signal SG transitions from the first voltage VH to the second voltage VL. Accordingly, the P-channel of the transmission gate TG, that is, the channel of the P-type transistor is turned on, and the N-channel of the transmission gate TG, that is, the channel of the N-type transistor is turned off. Thus, the on-current Ip flows through the P-type transistor of the transmission gate TG. The delay node ND is discharged gradually by the on-current Ip, and the delay signal SD transitions from the first voltage VH to the second voltage VL at time T2 after a first delay time tD1.

At time T3, the input signal SI transitions from the logic high level VH' to the logic low level VL', and the gate signal SG transitions from the second voltage VL to the first voltage VH. Accordingly, the P-channel of the transmission gate TG is turned off, and the N-channel of the transmission gate TG is turned on. Thus, the on-current In flows through the N-type transistor of the transmission gate TG. The delay node ND is charged gradually by the on-current In, and the delay signal SD transitions from the second voltage VL to the first voltage VH at time T4 after a second delay time tD2.

As such, since one of the P-type transistor and the N-type transistor of the transmission gate TG is turned on selectively and the other is turned off, the on-current In or Ip may be reduced in comparison with a case where both of the P-type transistor and the N-type transistor of the transmission gate TG are turned on. The charging time and the discharging time of the delay node ND may be reduced due to the decrease of the on-current, and thus the first delay time tD1 and the second delay time tD2 may be increased.

As illustrated in FIG. 9, the first voltage VH of the logic high level at the intermediate node NA may be transferred to the delay node ND through the N-type transistor of the transmission gate TG, and the second voltage VL of the logic low level at the intermediate node NA may be transferred to the delay node ND through the P-type transistor of the transmission gate TG. As mentioned above, the P-type transistor may cause voltage degradation when transferring the lower voltage, and the N-type transistor may cause the voltage degradation when transferring the higher voltage. The bidirectional delay circuit 12 of FIG. 8 may cause the voltage degradation because the P-type transistor transfers the lower voltage VL and the N-type transistor transfers the higher voltage VH. Accordingly, the voltage levels VH−Vthn and VL+Vthp of the delay signal SD may be different from the voltage levels VH and VL of the intermediate signal SA as illustrated in FIG. 10. Vthn is a threshold voltage of the N-type transistor of the transmission gate TG, and Vthp is a threshold voltage of the P-type transistor of the transmission gate TG. As a result, the swing width VH−VL−Vthn−Vthp of the delay signal SD may be less than the swing width VH–VL of the intermediate signal SA. As will be described with reference to FIG. 20, a plurality of delay circuits may be connected in series in order to implement a large delay amount, and the delay signal of a previous stage may be provided as the input signal of the next stage. If the delay signal SD having the reduced swing width as illustrated in FIG. 10 is provided as the input signal of the next stage, the delay circuit of the next stage may generate the further increased delay amount.

Figure 11A:
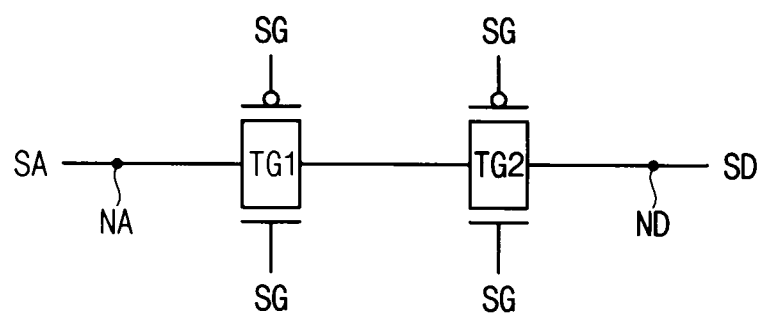
FIGS. 11A and 11B are diagrams illustrating example embodiments of a delay switch circuit included in the bidirectional delay circuit of FIG. 1.
Figure 11B:
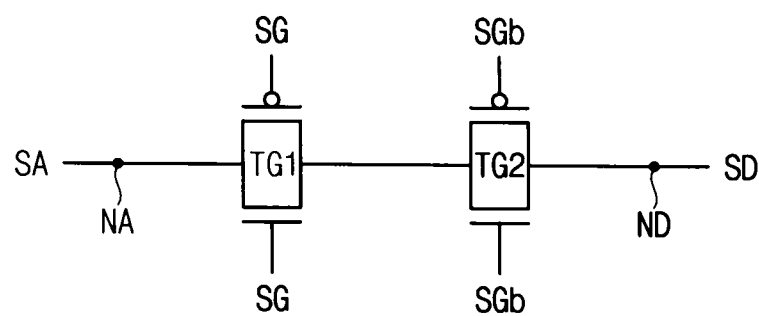

FIGS. 11A and 11B are diagrams illustrating example embodiments of a delay switch circuit included in the bidirectional delay circuit of FIG. 1.

FIGS. 11A and 11B illustrate non-limiting example embodiments of delay switch circuits 202 and 203 where two transmission gates TG1 and TG2 are connected in series between the intermediate node NA receiving the intermediate signal SA and the delay node ND outputting the delay signal SD, and three or more transmission gates may be connected in series between the intermediate node NA and the delay node ND.

In some example embodiments, the transmission gates TG1 and TG2 in the delay switch circuit 202 may receive the same gate signal SG as illustrated in FIG. 11A. In other example embodiments, at least one transmission gate TG1 of the transmission gates TG1 and TG2 in the delay switch circuit 203 may receive the gate signal SG, and the other transmission gate TG2 may receive the inverted gate signal SGb. The gate signal SG in FIGS. 11A and 11B may have the same transition timings as the input signal SI or the inversion signal of the input signal SI.

Figure 12B:
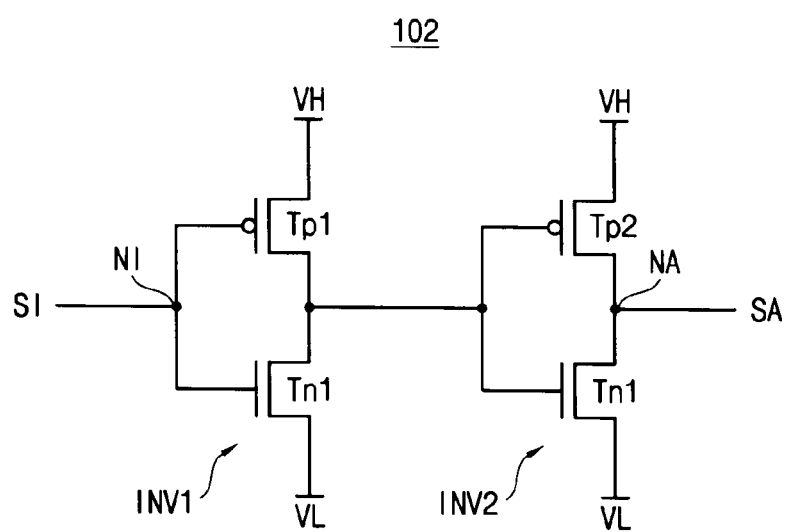

FIGS. 12A and 12B are diagrams illustrating example embodiments of an input driving circuit included in the bidirectional delay circuit of FIG. 1, which is implemented with single-stack inverters.

FIGS. 12A and 12B illustrate non-limiting example embodiments of input driving circuits 101 and 102 where one or two single-stack inverters INV1 and INV2 are connected in series between the input node NI receiving the input signal SI and the intermediate node NA outputting the intermediate signal SA, and three or more single-stack inverters may be connected in series between the input node NI and the intermediate node NA. The single-stack represents that one P-type transistor Tp1 or Tp2 and the one N-type transistor Tn1 or Tn2 are connected between the first voltage VH and the second voltage VL.

The input driving circuit may invert and amplify the input signal SI to generate the intermediate signal SA if an odd number of inverters are connected in series between the input node NI and the intermediate node NA. In contrast, the input driving circuit may amplify the input signal SI without inversion to generate the intermediate signal SA if an even number of inverters are connected in series between the input node NI and the intermediate node NA. The even number of inverters may be referred to as a buffer.

Figure 13A:
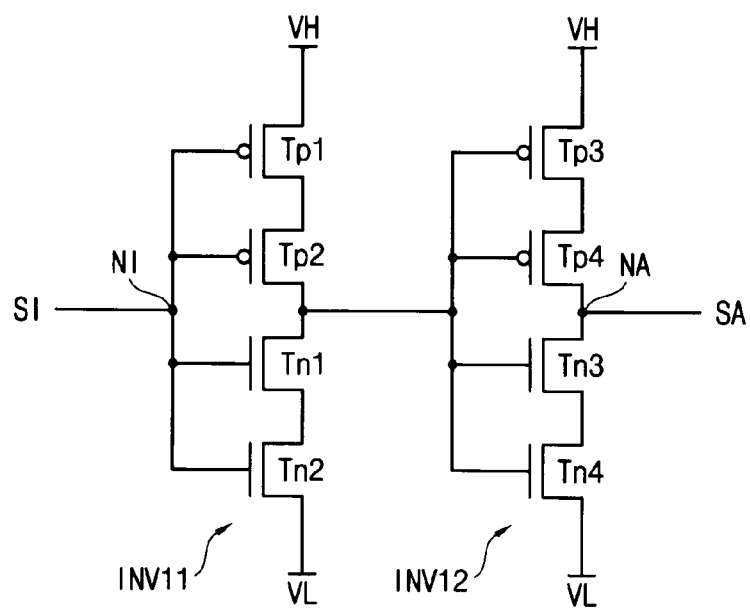
FIGS. 13A and 13B are diagrams illustrating example embodiments of an input driving circuit included in the bidirectional delay circuit of FIG. 1, which is implemented with multi-stack inverters.
Figure 13B:
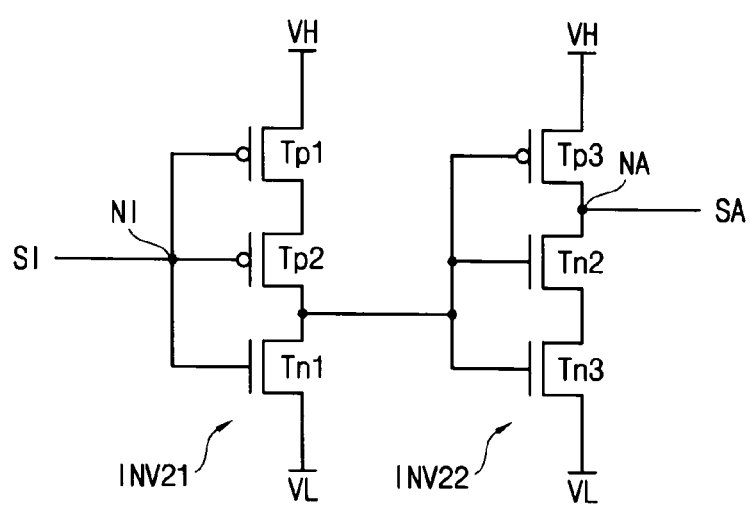

FIGS. 13A and 13B are diagrams illustrating example embodiments of an input driving circuit included in the bidirectional delay circuit of FIG. 1, which is implemented with multi-stack inverters.

FIGS. 13A and 13B illustrate non-limiting example embodiments of input driving circuits 103 and 104 where two multi-stack inverters INV11 and INV12 or INV21 and INV22 are connected in series between the input node NI receiving the input signal SI and the intermediate node NA outputting the intermediate signal SA, and one multi-stack inverter or three or more multi-stack inverters may be connected in series between the input node NI and the intermediate node NA. The multi-stack represents that at least one of the number of P-type transistors Tp1, Tp2, Tp3 and Tp4 and the number of N-type transistors Tn1, Tn2, Tn3 and Tn4 connected between the first voltage VH and the second voltage VL is greater than one. FIG. 13A illustrates an example configuration where the stack number of the P-type transistors is equal to the stack number of the N-type transistors, and FIG. 14B illustrates another example configuration where the stack number of the P-type transistors is different from the stack number of the N-type transistors.

The multi-stack inverter may have the larger delay amount than the single-stack inverter. A certain delay amount may be implemented through the input driving circuit in addition to the delay switch circuit by increasing the number of inverters connected in series (that is, a stage number) and/or the stack number of each inverter. However, the implementation of the delay amount in the input driving circuit may be limited due to waveform distortion of a propagated signal, delay to occupation area efficiency, etc.

Figure 14:
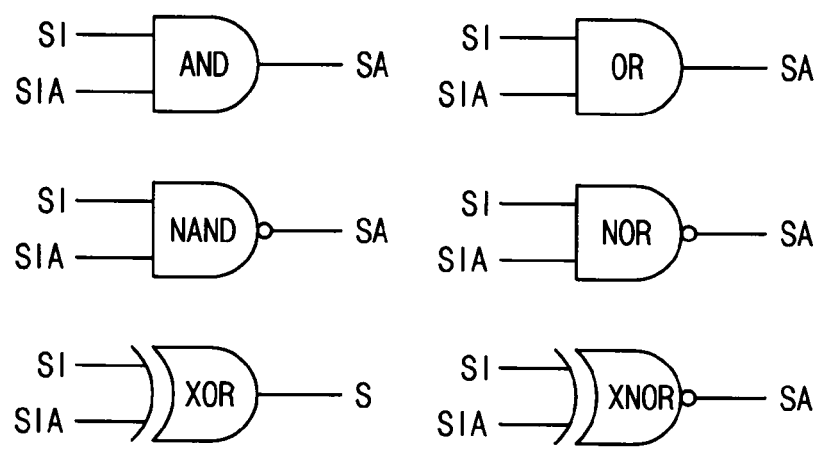
FIG. 14 is a diagram illustrating gate circuits that may be included in the input driving circuit.

FIG. 14 is a diagram illustrating gate circuits that may be included in the input driving circuit.

The input driving circuit 100 in FIG. 1 may include at least one of the gate circuits as illustrated in FIG. 14. For example, the gate circuits may include an inverter, a buffer, an AND gate, an OR gate, a NAND gate, a NOR gate, an exclusive OR (XOR) gate and an exclusive NOR (XNOR) gate, etc. The gate circuit may receive at least one signal SIA in addition to the input signal SI. Using these gate circuits, a required logic operation may be performed and simultaneously a required delay amount may be implemented.

Figure 15:
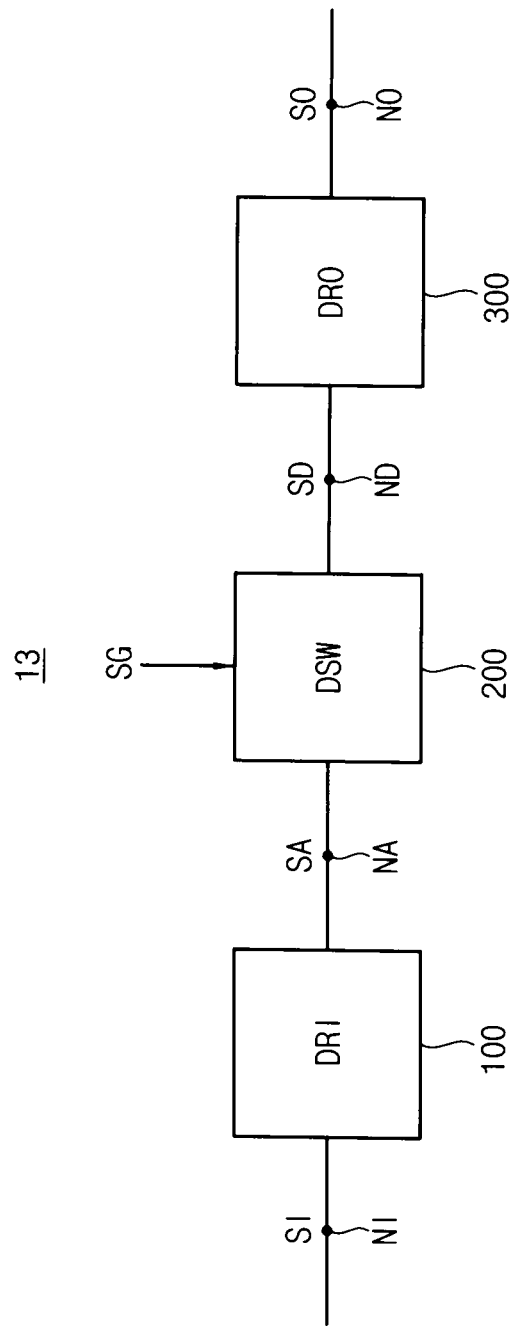
FIG. 15 is a block diagram illustrating a bidirectional delay circuit according to example embodiments.

FIG. 15 is a block diagram illustrating a bidirectional delay circuit according to example embodiments.

Referring to FIG. 15, a bidirectional delay circuit 13 may include an input driving circuit DRI 100, a delay switch circuit DSW 200 and an output driving circuit DRO.

The input driving circuit 100 is connected between an input node NI and an intermediate node NA. The input driving circuit 100 may amplify an input signal SI received through the input node NI to generate an intermediate signal SA through the intermediate node NA. The delay switch circuit 200 is connected between the intermediate node NA and a delay node ND. The delay switch circuit 200 may delay both of rising edges and falling edges of the intermediate signal 200 in response to a gate signal SG to generate a delay signal SD through the delay node ND. The gate signal SG may transition in response to the input signal SI. The output driving circuit 300 is connected between the delay node ND and an output node NO. The output driving circuit 300 may amplify the delay signal SD to generate an output signal SO through the output node NO.

Figure 20:
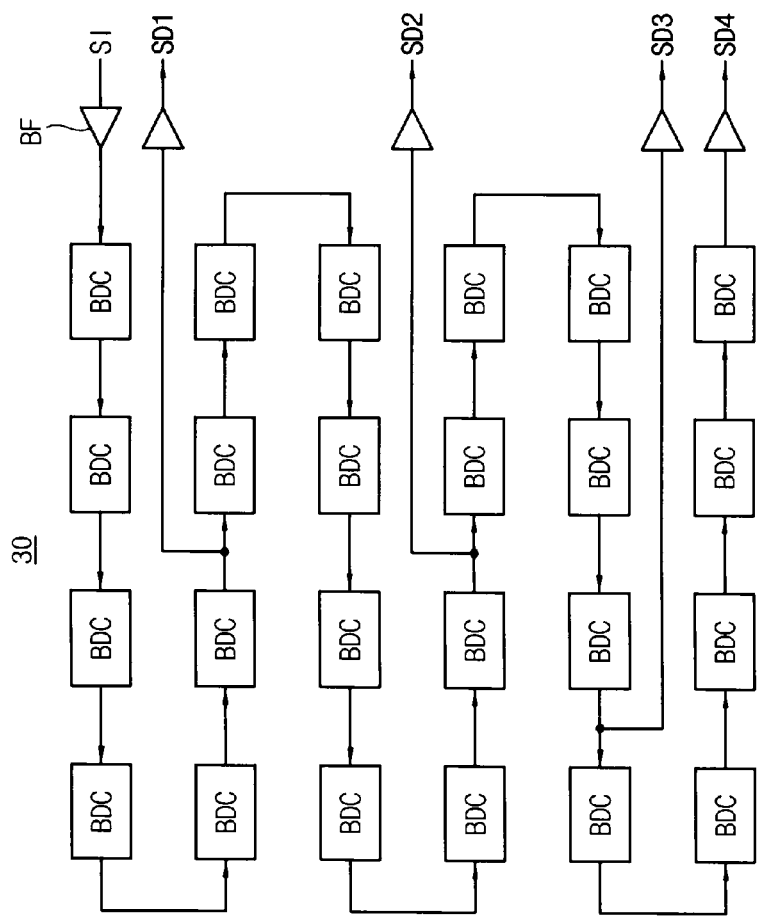
FIG. 20 is a diagram illustrating an integrated circuit including a bidirectional delay circuit according to example embodiments.

The output driving circuit 300 may have a configuration equal to or similar to that of the input driving circuit 100. The output driving circuit 300 may include at least one inverter, at least one gate circuit or a combination thereof. When implementing an integrated circuit of a delay chain as illustrated in FIG. 20, a plurality of bidirectional delay circuits 10 of FIG. 1 may be connected repeatedly, or a plurality of bidirectional delay circuits 13 of FIG. 15 may be connected repeatedly. Also, the bidirectional delay circuits 10 of FIG. 1 and the bidirectional delay circuits 13 of FIG. 15 may be connected alternatively.

According to example embodiments, the gate signal SG may be a signal that transitions in response to the input signal SI. As described above, the input signal SI itself may be provided as the gate signal SG in some example embodiments, or the inversion signal of the input signal SI may be provided as the gate signal SG in other example embodiments.

In addition, according to example embodiments, the delay signal SD may have the bidirectional delay such that both of the rising edges RE and the falling edges FE of the intermediate signal SA are delayed. The intermediate signal SA is amplified from the input signal SI. Accordingly, the delay signal SD may be a signal that is generated by delaying both of the rising edges RE and the falling edges FE of the input signal SI.

As such, the bidirectional delay circuit 13 according to example embodiments may delay both of the rising edges RE and the falling edges FE of the input signal SI using the gate signal SG that transitions in response to the input signal SI, thereby implementing a larger delay amount with a less circuit area.

Figure 16:
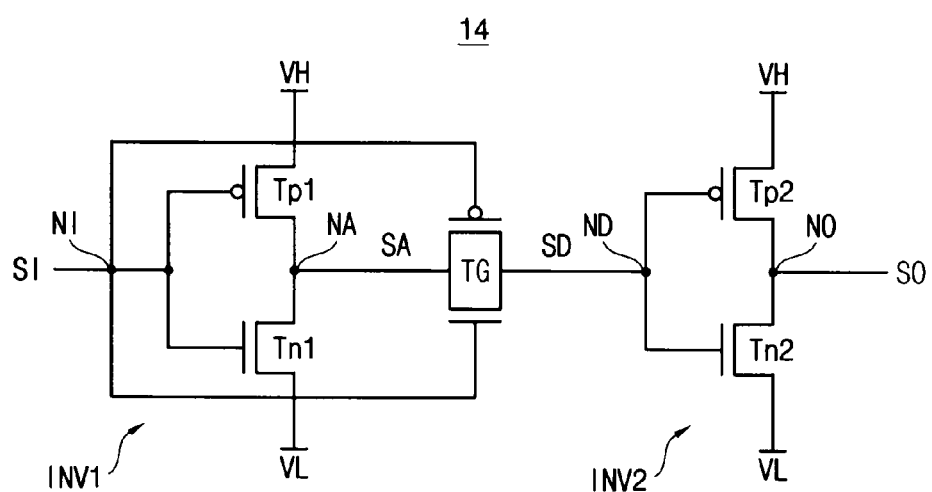
FIG. 16 is a circuit diagram illustrating a bidirectional delay circuit according to an example embodiment.
Figure 17:
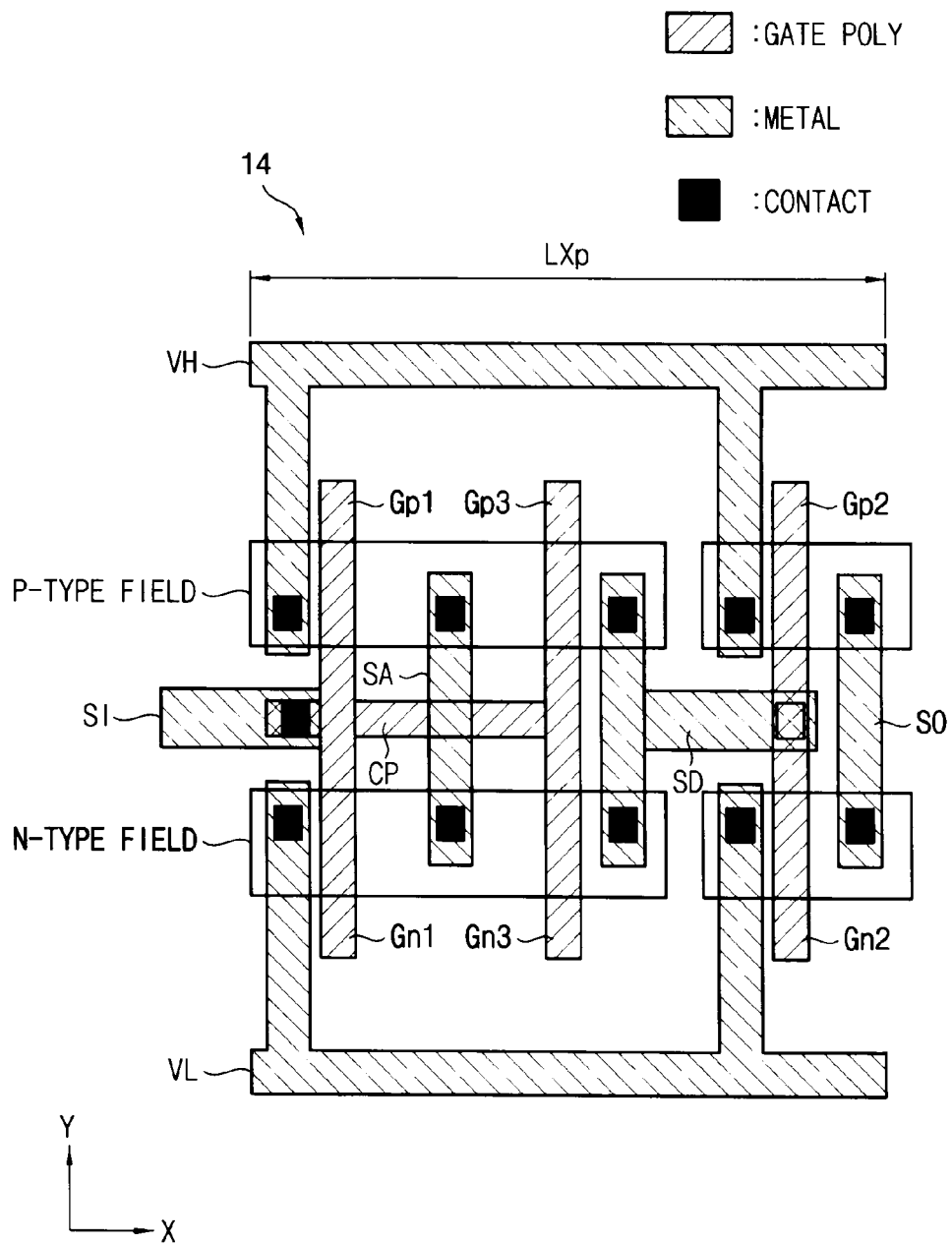
FIG. 17 is a diagram illustrating an example layout of the bidirectional delay circuit of FIG. 16.

FIG. 16 is a circuit diagram illustrating a bidirectional delay circuit according to an example embodiment, and FIG. 17 is a diagram illustrating an example layout of the bidirectional delay circuit of FIG. 16.

Referring to FIGS. 16 and 17, a bidirectional delay circuit 14 may include a first inverter INV1, a transmission gate TG and a second inverter INV2. The first inverter INV1 may correspond to the above-mentioned input driving circuit, the transmission gate TG may correspond to the above-mentioned delay switch circuit, and the second inverter INV2 may correspond to the above-mentioned output driving circuit.

The first inverter INV1 may include a P-type transistor Tp1 connected between a first voltage VH and an intermediate node NA, and an N-type transistor Tn1 connected between the intermediate node NA and a second voltage VL. Gate electrodes of the transistors Tp1 and Tn1 may be connected to an input node NI. The first inverter INV1 may be connected between the input node NI and the intermediate node NA. The first inverter INV1 may invert and amplify an input signal SI received through the input node NI to generate an intermediate signal SA through the intermediate node NA.

The second inverter INV2 may include a P-type transistor Tp2 connected between the first voltage VH and an output node NO, and an N-type transistor Tn2 connected between the output node NO and the second voltage VL. Gate electrodes of the transistors Tp2 and Tn2 may be connected to the delay node ND. The second inverter INV2 may be connected between the delay node ND and the output node NO. The second inverter INV2 may invert and amplify the delay signal SD received through the delay node ND to generate an output signal SO through the output node NO.

The first inverter INV1 and the second inverter INV2 may be powered by the first voltage VH and the second voltage VL lower than the first voltage VH. For example, the first voltage VH may be a power supply voltage VDD and the second voltage VL may be a ground voltage VSS.

The transmission gate TG may be connected between the intermediate node NA and the delay node ND. The transmission gate TG may delay both of rising edges and falling edges of the intermediate signal SA in response to a gate signal SG to generate the delay signal SD through the delay node ND. The gate signal SG may transition in response to the input signal SI.

Referring to FIG. 17, active regions corresponding to source and drain of the P-type transistors Tp1 and Tp2 may be formed in a P-type field of a semiconductor substrate, and active regions corresponding to source and drain of the N-type transistors Tn1 and Tn2 may be formed in an N-type field of the semiconductor substrate. A gate poly is patterned over the semiconductor substrate to form the gates Gp1, Gp2, Gn1 and Gn2 of the transistors Tp1, Tp2, Tn1 and Tn2, and the gates Gp3 and Gn3 of the transmission gate TG. The metal wires are patterned and formed over the gate poly. The active regions in the semiconductor substrate, the gate poly and the metal wires may be connected through vertical contacts.

In some example embodiments, as illustrated in FIGS. 16 and 17, the P-type gate electrode Gp3 and the N-type gate electrode Gn3 of the transmission gate TG may be, through a conduction path CP, electrically connected to the input node NI receiving the input signal SI. In other words, the input signal SI may be provided as the gate signal SG. As illustrated in FIG. 17, the conduction path CP may include the gate poly that is formed and patterned together with the P-type gate electrode Gp3 and the N-type gate electrode Gn3. In addition, the gate electrodes Gp1 and Gn1 of the first inverter INV1 may include the gate poly that is formed and patterned together with the conduction path CP. The gate electrodes Gp1 and Gn1 of the first inverter INV1, the conduction path CP and the gate electrodes Gp3 and Gn3 of the transmission gate TG may be formed all in one, and thus they may be electrically connected to each other.

In other example embodiments, different from FIG. 17, the P-type gate electrode Gp3 and the N-type gate electrode Gn3 of the transmission gate TG may be electrically connected to the input node NI receiving the input signal SI, through a conduction path that is formed by patterning the metal wires over the gate poly.

Figure 18:
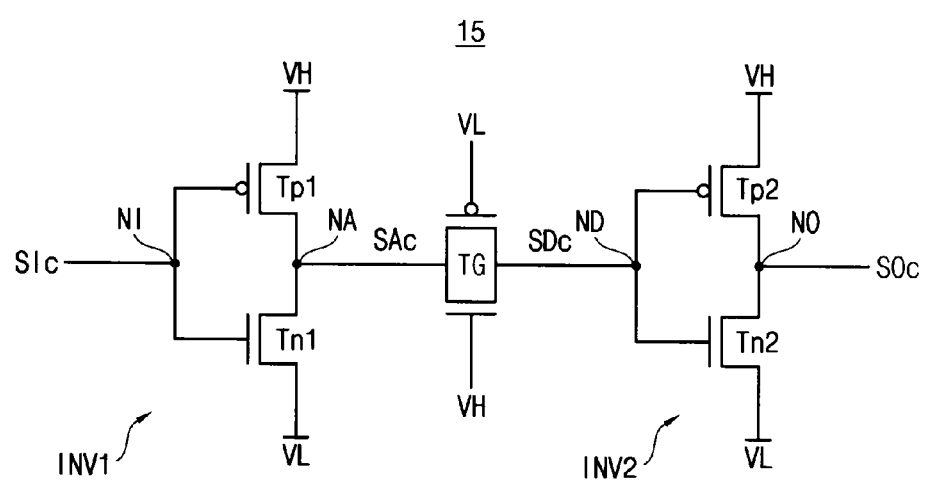
FIG. 18 is a circuit diagram illustrating a bidirectional delay circuit using a gate signal having fixed voltage levels.
Figure 19:
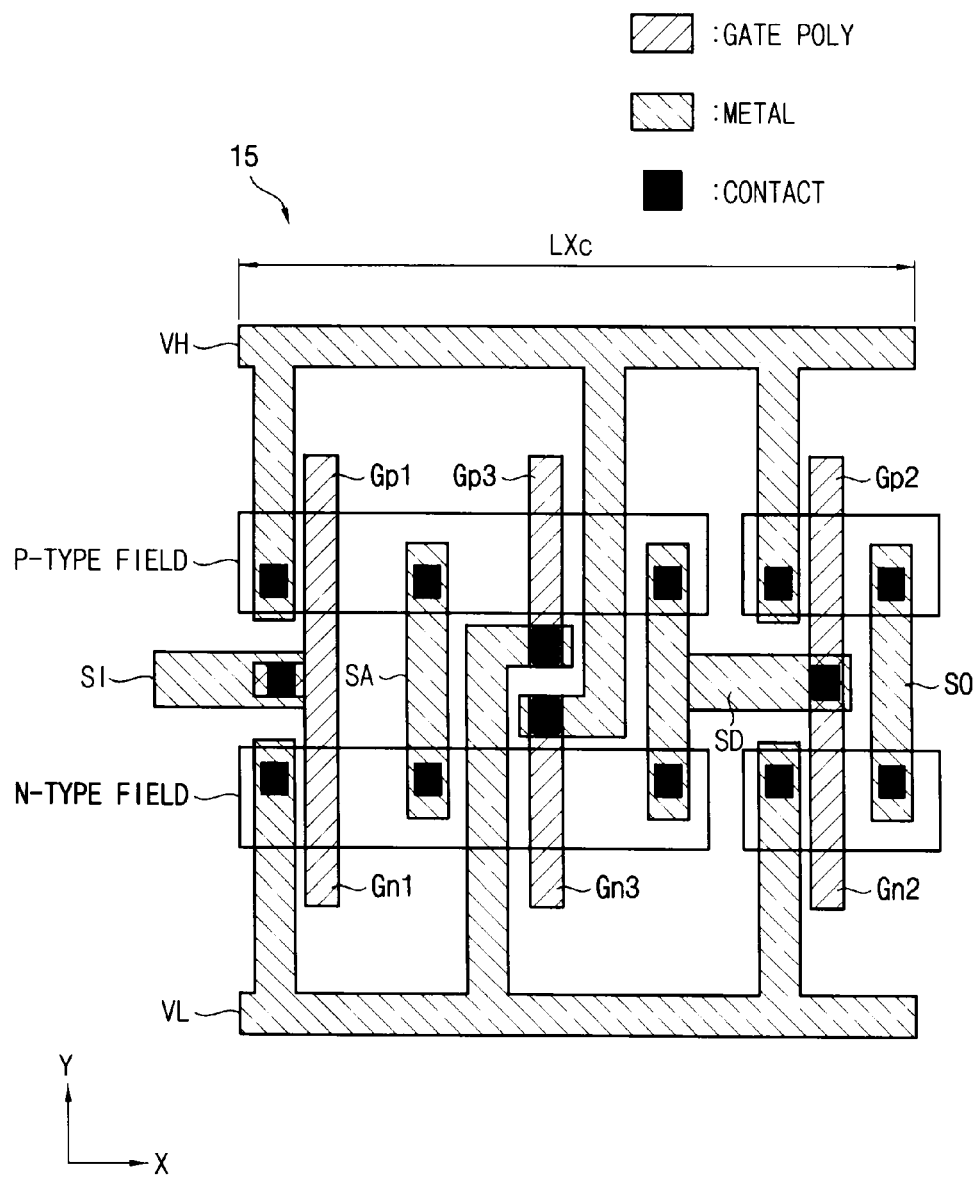
FIG. 19 is a diagram illustrating an example layout of the bidirectional delay circuit of FIG. 18.

FIG. 18 is a circuit diagram illustrating a bidirectional delay circuit using a gate signal having fixed voltage levels, and FIG. 19 is a diagram illustrating an example layout of the bidirectional delay circuit of FIG. 18.

Referring to FIGS. 18 and 19, a bidirectional delay circuit 15 may include a first inverter INV1, a transmission gate TG and a second inverter INV2. The first inverter INV1 may correspond to the above-mentioned input driving circuit, the transmission gate TG may correspond to the above-mentioned delay switch circuit, and the second inverter INV2 may correspond to the above-mentioned output driving circuit.

The first inverter INV1 may include a P-type transistor Tp1 connected between a first voltage VH and an intermediate node NA, and an N-type transistor Tn1 connected between the intermediate node NA and a second voltage VL. Gate electrodes of the transistors Tp1 and Tn1 may be connected to an input node NI. The first inverter INV1 may be connected between the input node NI and the intermediate node NA. The first inverter INV1 may invert and amplify an input signal SIc received through the input node NI to generate an intermediate signal SAc through the intermediate node NA.

The second inverter INV2 may include a P-type transistor Tp2 connected between the first voltage VH and an output node NO, and an N-type transistor Tn2 connected between the output node NO and the second voltage VL. Gate electrodes of the transistors Tp2 and Tn2 may be connected to the delay node ND. The second inverter INV2 may be connected between the delay node ND and the output node NO. The second inverter INV2 may invert and amplify the delay signal SDc received through the delay node ND to generate an output signal SOc through the output node NO.

The transmission gate TG may be connected between the intermediate node NA and the delay node ND. In comparison with the bidirectional delay circuit 13 of FIGS. 16 and 17, the fixed second voltage VL is applied to the P-type gate electrode Gp3 of the transmission gate TG, and the fixed first voltage VH is applied to the N-type gate electrode Gn3 of the transmission gate TG in the bidirectional delay circuit 15 of FIGS. 18 and 19.

In the bidirectional delay circuit 15 of FIGS. 18 and 19, both of the P-channel and the N-channel of the transmission gate TG are turned on regardless of the input signal Sic. In contrast, one of the P-channel and the N-channel of the transmission gate TG is turned on and the other is turned off in response to the logic level of the gate signal SG in the bidirectional delay circuit 14 of FIGS. 16 and 17. Accordingly, the bidirectional delay circuit 14 of FIGS. 16 and 17 may implement a larger delay amount by reducing the on-current of the transmission gate TG in the bidirectional delay circuit 15 of FIGS. 18 and 19. Referring to FIGS. 17 and 19, the bidirectional delay circuits 14 and 15 may have the same length in the vertical direction Y, but the bidirectional delay circuit 14 of FIG. 17 may have a length LXp in the horizontal direction X that is shorter than the length LXc of the bidirectional delay circuit 15 of FIG. 19.

As such, the bidirectional delay circuit 14 according to example embodiments may delay both of the rising edges and the falling edges of the input signal SI using the gate signal SG that transitions in response to the input signal SI, thereby implementing a larger delay amount with a less circuit area.

FIG. 20 is a diagram illustrating an integrated circuit including a bidirectional delay circuit according to example embodiments.

Referring to FIG. 20, an integrated circuit 30 may include a plurality of bidirectional delay circuits BDC that are cascade-coupled to form a delay chain. Each of the plurality of bidirectional delay circuits receives a delay signal from the bidirectional delay circuit of a previous stage as an input signal. As described above, each bidirectional delay circuit may include an input driving circuit and a delay switch circuit. The input driving circuit may be connected between an input node and an intermediate node, and the input driving circuit may amplify the input signal received through the input node to generate an intermediate signal through the intermediate node. The delay switch circuit may be connected between the intermediate node and a delay node, and the delay switch circuit may delay both of rising edges and falling edges of the intermediate signal in response to a gate signal to generate the delay signal through the delay node. The gate signal may transition in response to the input signal.

The input signal SI may be input to the bidirectional delay circuit of the first stage, and the delay signals SD1, SD2, SD3 and SD4 having various delay amounts may be extracted through the appropriate connection nodes between the plurality of bidirectional delay circuits BDC. The buffers BF may be disposed for buffering the input signal SI and the delay signals SD1, SD2, SD3 and SD4.

The plurality of bidirectional delay circuits BDC according to example embodiments may delay both of the rising edges and the falling edges of the input signal using the gate signal transitioning in response to the input signal, and a larger delay amount may be implemented with a less circuit area. Using the plurality of bidirectional delay circuits BDC, the integrated circuit 30 may decrease the stage number, that is, the number of the bidirectional delay circuits, and thus the size of the integrated circuit 30 and device or system including the integrated circuit 30 may be reduced.

Figure 21:
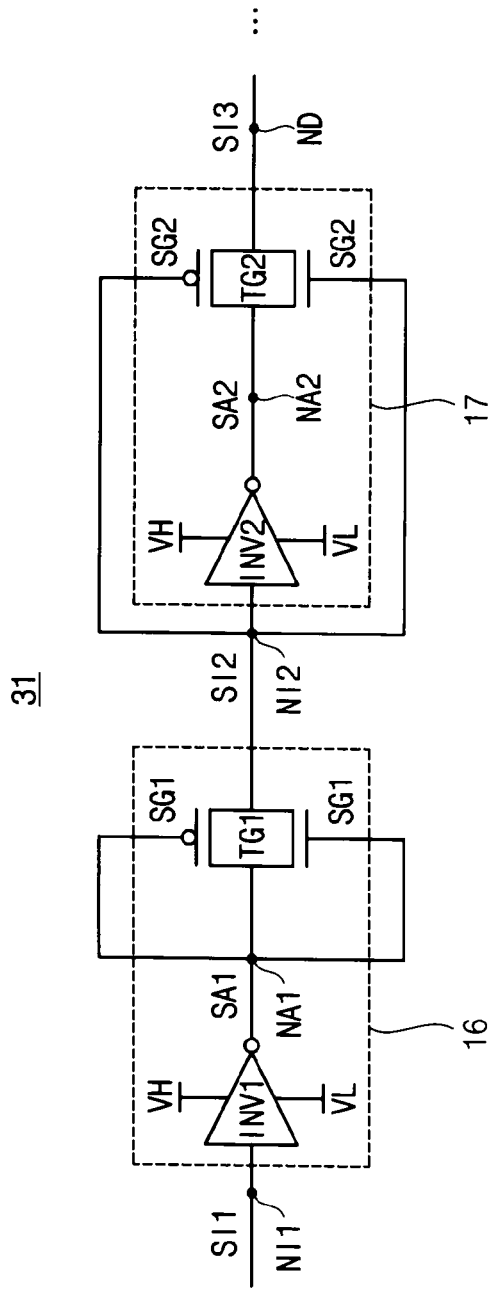
FIG. 21 is a diagram illustrating example bidirectional delay circuits included in the integrated circuit of FIG. 20.
Figure 22:
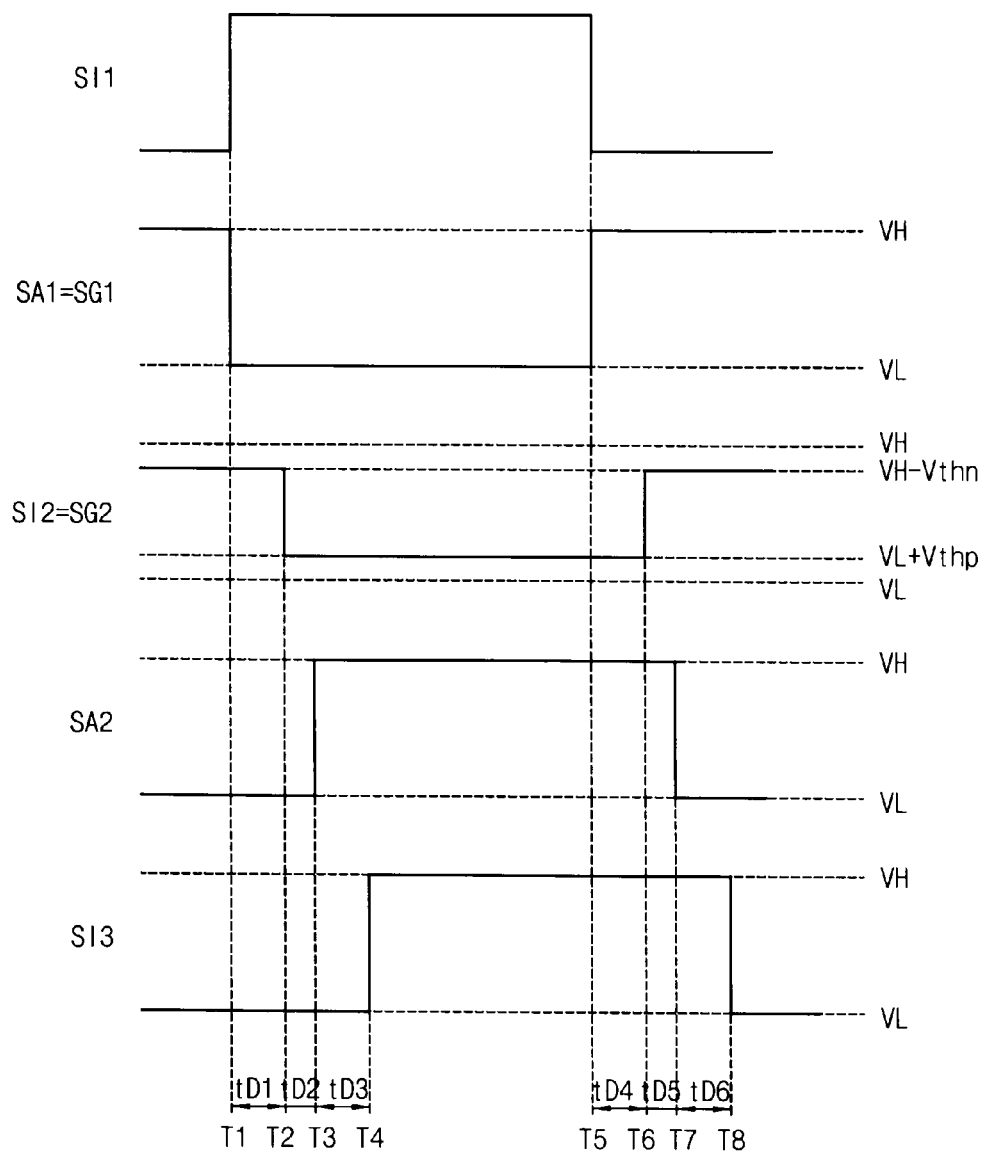
FIG. 22 is a timing diagram illustrating operations of the bidirectional delay circuits of FIG. 21.

FIG. 21 is a diagram illustrating example bidirectional delay circuits included in the integrated circuit of FIG. 20, and FIG. 22 is a timing diagram illustrating operations of the bidirectional delay circuits of FIG. 21.

Referring to FIG. 21, an integrated circuit 31 may include a first bidirectional delay circuit 16 and a second bidirectional delay circuit 17. Other bidirectional delay circuits may be disposed before the first bidirectional delay circuit 16 and/or after the second bidirectional delay circuit 17.

The first bidirectional delay circuit 16 may delay a first input signal SI1 in response to a first gate signal SG1 to generate a first delay signal. The second bidirectional delay circuit 17 may receive the first delay signal as a second input signal SI2, and may delay the second input signal SI2 in response to a second gate signal SG2 to generate a second delay signal. The second delay signal may be provided to a next stage as an third input signal SI3.

The first bidirectional delay circuit 16 may include a first inverter INV1 and a first transmission gate TG1. The first inverter INV1 may be connected between a first input node NI1 and a first intermediate node NA1 to generate a first intermediate signal SA1. The first transmission gate TG1 may be connected between the first intermediate node NA1 and a second input node NI2 to generate the second input signal SI2. The second bidirectional delay circuit 17 may include a second inverter INV2 and a second transmission gate TG2. The second inverter INV2 may be connected between the second input node NI2 and a second intermediate node NA2 to generate a second intermediate signal SA2. The second transmission gate TG2 may be connected between the second intermediate node NA2 and a third input node NI3 to generate the third input signal SI3.

The first bidirectional delay circuit 16 may receive an inversion signal of the first input signal SI1, that is, the first intermediate signal SA1, as the first gate signal SA1. The second bidirectional delay circuit 17 may receive the second input signal SI2 as the second gate signal SG2. The first bidirectional delay circuit may be substantially the same as the bidirectional delay circuit 12 described with reference to FIGS. 8, 9 and 10. The second bidirectional delay circuit 17 may be substantially the same as the bidirectional delay circuit 11 described with reference to FIGS. 5, 6 and 7.

Referring to FIG. 22, the first intermediate signal SA1 may be provided as the first gate signal SG1 because the gate electrodes of the first transmission gate TG1 are electrically connected to the first intermediate node NA1. The voltage levels of the first input signal SI1 may be equal to or different from the first voltage VH and the second voltage VL, respectively. The first gate signal SG1 and the first intermediate signal SA1 at the first intermediate node NA1 may be inverted with respect to the first input signal SI1, and thus the first delay signal or the second input signal SI2 at the first delay node or the second input node NI2 may be inverted with respect to the first input signal SI1.

At time T1, the first input signal SI1 transitions from the logic low level to the logic high level, and the first gate signal SG transitions from the first voltage VH to the second voltage VL. Accordingly, the P-channel of the first transmission gate TG1, that is, the channel of the P-type transistor is turned on, and the N-channel of the first transmission gate TG1, that is, the channel of the N-type transistor is turned off. Thus, the on-current Ip flows through the P-type transistor of the first transmission gate TG1. The second input node NI2 is discharged gradually by the on-current Ip, and the second input signal SI2 transitions from the logic high level VH−Vthn to the logic low level VL+Vthp at time T2 after a first delay time tD1.

The second input signal SI2 may be provided as the second gate signal SG2 because the gate electrodes of the second transmission gate TG2 are electrically connected to the second input node NI2. The voltage levels VH−Vthn and VL+Vthp of the second input signal SI2 and the second gate signal SG2 may be different from the voltage levels VH and VL of the first intermediate signal SA1 as described with reference to FIGS. 8 and 9. The second intermediate signal SA2 at the second intermediate node NA2 may be inverted and delayed with respect to the second input signal SI2 and the second gate signal SG2, and thus the second delay signal or the third input signal SI3 at the second delay node or the third input node NI3 may be inverted and delayed with respect to the second input signal SI2 and the second gate signal SG2.

At time T2, the second input signal SI2 and the second gate signal SG2 transition from the logic high level VH−Vthn to the logic low level VL+Vthp. Accordingly, the P-channel of the second transmission gate TG2 is turned on, and the N-channel of the second transmission gate TG2 is turned off. Thus, the on-current Ip flows through the P-type transistor of the second transmission gate TG2. The second intermediate signal SA2 transitions from the second voltage VL to the first voltage VH at time T3 after a second delay time tD2, and the third input signal SI3 transitions from the second voltage VL to the first voltage VH at time T4 after a third delay time tD3.

In this way, if the first input signal transitions from the logic high level to the logic low level at time T5, the second input signal SI2 transitions from the logic low level VL+Vthp to the logic high level VH−Vthn at time T6 after a fourth delay time tD4. The second intermediate signal SA2 transitions from the first voltage VH to the second voltage VL at time T7 after a fifth delay time tD5, and the third input signal SI3 transitions from the first voltage VH to the second voltage VL at time T8 after a sixth delay time tD6.

As a result, the delay amount may be further increased by the second delay time tD2 and the fifth delay time tD5 according to the decrease of the swing width of the second input signal SI2, and the waveform of the third input signal SI3 may be maintained substantially the same as the waveform of the first input signal SI1.

Figure 23:
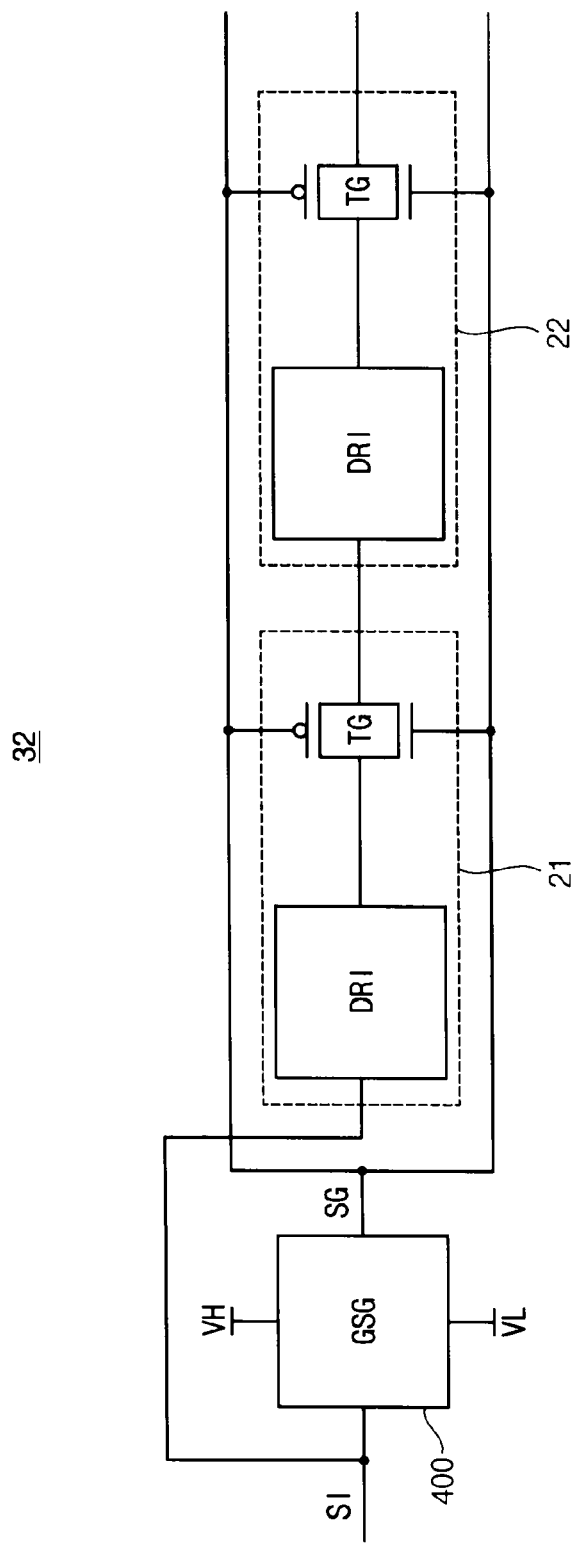
FIG. 23 is a diagram illustrating an integrated circuit according to example embodiments.

FIG. 23 is a diagram illustrating an integrated circuit according to example embodiments.

Referring to FIG. 23, an integrated circuit 32 may include a gate signal generator GSG 400, a first bidirectional delay circuit 21 and a second bidirectional delay circuit 22. Each of the first bidirectional delay circuit 21 and the second bidirectional delay circuit 22 may have various configurations as described with reference to FIGS. 1 through 19. For example, each of the first bidirectional delay circuit 21 and the second bidirectional delay circuit 22 may include an input driving circuit DRI and a transmission gate TG as illustrated in FIG. 23. As described above, the input driving circuit DRI may be connected between an input node and an intermediate node, and the input driving circuit DRI may amplify the input signal received through the input node to generate an intermediate signal through the intermediate node. The transmission gate TG may be connected between the intermediate node and a delay node, and the transmission gate TG may delay both of rising edges and falling edges of the intermediate signal in response to a gate signal SG to generate the delay signal through the delay node. The gate signal SG may transition in response to the input signal.

The gate signal generator 400 may be powered by a first voltage VH and a second voltage VL lower than the first voltage VH. The gate signal generator 400 may generate the gate signal SG transitioning between a first gate voltage VHD and a second gate voltage VLU, such that the first gate voltage VHD is lower than the first voltage VH and the second gate voltage VLU is higher than the second voltage VL.

The on-current Ip or In flowing through the transmission gate TG may be reduced by reducing the swing width of the gate signal SG applied to the transmission gate TG, and thus the propagation time of the transmission gate, that is, the delay amount may be further increased.

Figure 24:
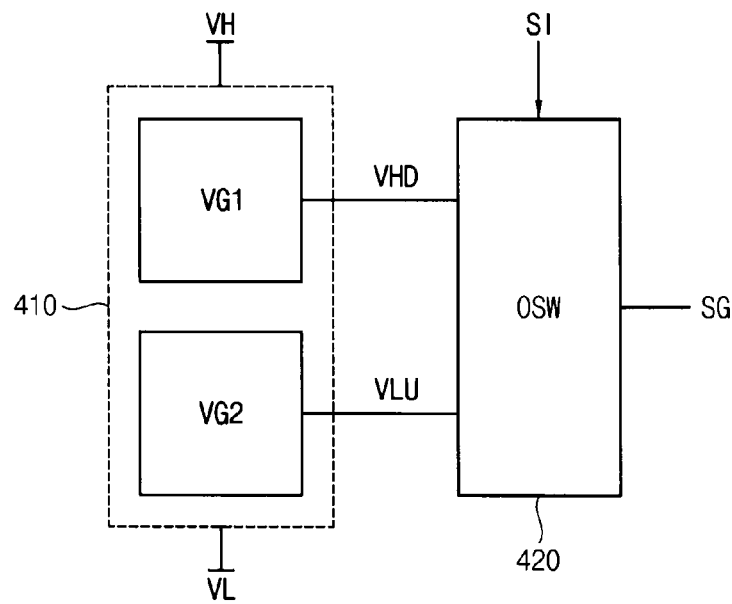
FIG. 24 is a block diagram illustrating an example embodiment of a gate signal generator included in the bidirectional delay circuit of FIG. 23.

FIG. 24 is a block diagram illustrating an example embodiment of a gate signal generator included in the bidirectional delay circuit of FIG. 23.

Referring to FIG. 24, a gate signal generator 400 may include a voltage generator 410 and an output switch circuit OSW 420. The voltage generator 410 may include a first voltage generator VG1 and a second voltage generator VG2.

The first voltage generator VG1 may generate the first gate voltage VHD lower than the first voltage VH, and the second voltage generator VG2 may generate the second gate voltage VLU higher than the second voltage VL. The output switch circuit 420 may select one of the first gate voltage VHD and the second gate voltage VLU to output the gate signal SG.

Hereinafter, example embodiments of the gate signal generator 400 are described with reference to FIGS. 25 through 31. It is to be understood that the provided example embodiments are not to be construed as limited to the specific example embodiments disclosed.

Figure 25:
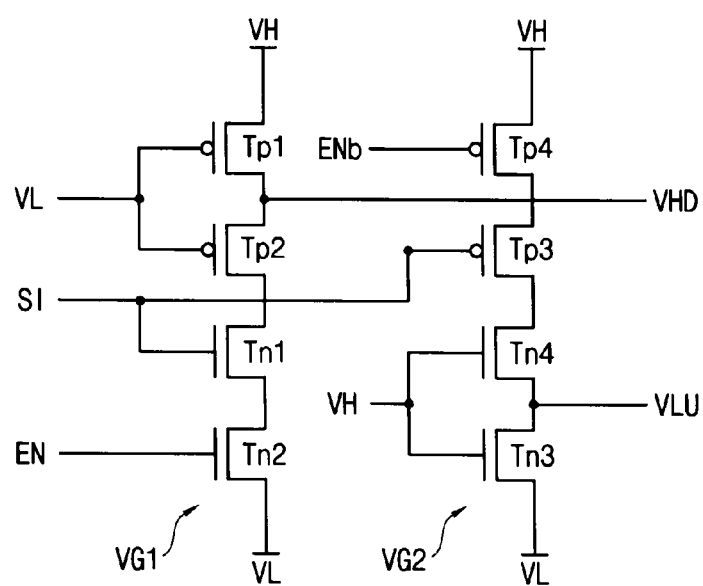
FIG. 25 is a circuit diagram illustrating a first voltage generator and a second voltage generator included in the gate signal generator of FIG. 24.
Figure 26:
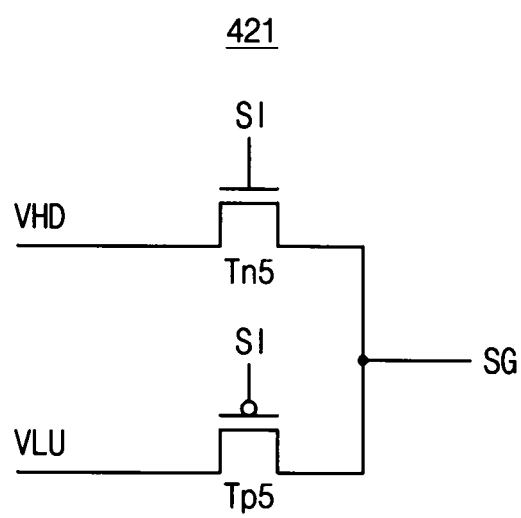
FIG. 26 is a circuit diagram illustrating an example embodiment of an output switch circuit included in the gate signal generator of FIG. 24.

FIG. 25 is a circuit diagram illustrating a first voltage generator and a second voltage generator included in the gate signal generator of FIG. 24, and FIG. 26 is a circuit diagram illustrating an example embodiment of an output switch circuit included in the gate signal generator of FIG. 24.

Referring to FIG. 25, a first voltage generator VG1 may include a first P-type transistor Tp1, a second P-type transistor Tp2, a first N-type transistor Tn1 and a second N-type transistor Tn2 sequentially connected from the first voltage VH to the second voltage VL. The second voltage generator VG2 may include a third N-type transistor Tn3, a fourth N-type transistor Tn4, a third P-type transistor Tp3 and a fourth P-type transistor Tp4 sequentially connected from the second voltage VL to the first voltage VH. FIG. 25 illustrates a non-limiting example embodiment of the voltage generators VG1 and VG2 including two-stack inverters, and the voltage generators may be implemented with inverters of three or more stacks.

In the first voltage generator VG1, the second voltage VL may be applied to gate electrodes of the first P-type transistor Tp1 and the second P-type transistor Tp2, and the first gate voltage VHD may be provided through a connection node of the first P-type transistor Tp1 and the second P-type transistor Tp2. The input signal SI may be applied to a gate electrode of the first N-type transistor Tn1, and an enable signal EN may be applied to a gate electrode of the second N-type transistor Tn2.

In the second voltage generator VG2, the first voltage VH may be applied to gate electrodes of the third N-type transistor Tn3 and the fourth N-type transistor Tn4, and the second gate voltage VLU may be provided through a connection node of the third N-type transistor Tn3 and the fourth N-type transistor Tn4. The input signal SI may be applied to a gate electrode of the third P-type transistor Tp3, and an inversion signal ENb of the enable signal EN may be applied to a gate electrode of the fourth P-type transistor Tp4.

The enable signal EN may be provided from a control logic or a timing logic of a device or a system including the bidirectional delay circuit. For example, the voltage generators VG1 and VG2 may be enabled if the enable signal is activated in a logic high level, and the voltage generators VG1 and VG2 may be disabled if the enable signal is deactivated in a logic low level.

Referring to FIG. 26, an output switch circuit 421 may include a first output switch Tn5 and a second output switch Tp5. The first output switch Tn5 may provide the first gate voltage VHD as a voltage level of the gate signal SG in response to the input signal SI. The second output switch Tp5 may provide the second gate voltage VLU as the voltage level of the gate signal SG in response to the input signal SI.

FIG. 26 illustrates a non-limiting example embodiment where the first output switch is implemented with the N-type transistor Tn5 and the second output switch is implemented with the P-type transistor Tp5. In other example embodiments, the first output switch may be implemented with a P-type transistor, and the second output switch may be implemented with an N-type transistor. In this case, an inversion signal of the input signal SI may be applied as the control signal of the output switch circuit 421. The output switches may not be implemented with transistors, and the output switch circuit 421 may be implemented with arbitrary switching elements that may perform switching operations in response to the input signal SI.

Figure 27:
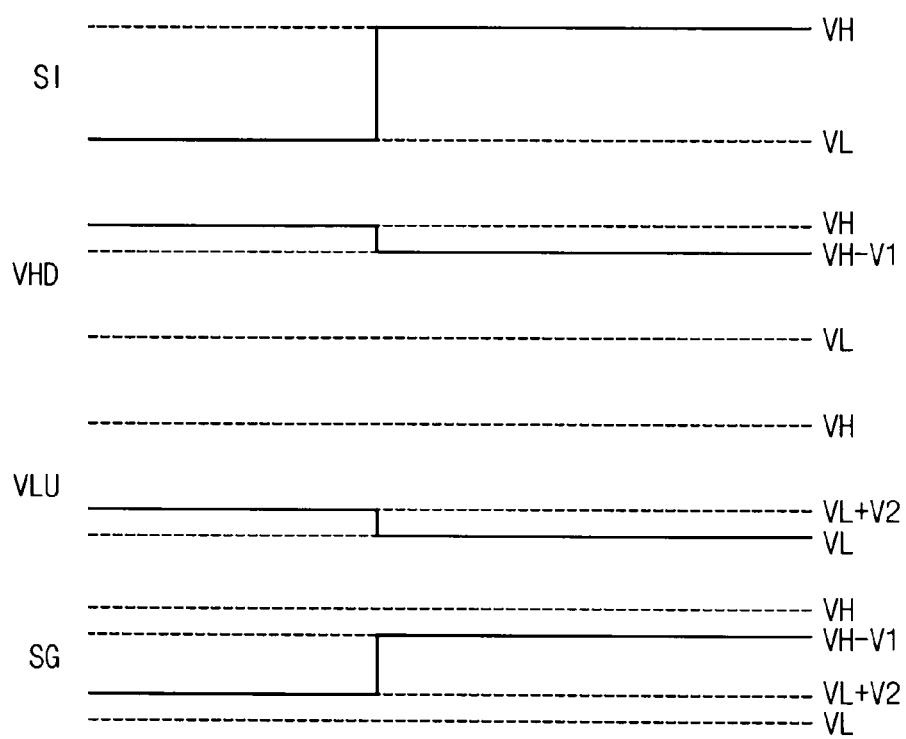
FIG. 27 is a timing diagram illustrating an example operation of the gate signal generator of FIG. 24.

FIG. 27 is a timing diagram illustrating an example operation of the gate signal generator of FIG. 24.

Referring to FIGS. 24, 25, 26 and 27, the input signal SI may be a signal transitioning between the first voltage VH and the second voltage VL.

When the input signal SI has the second voltage VL, the first N-type transistor Tn1 is turned off and the third P-type transistor Tp3 is turned on. Accordingly, the first gate voltage VHD is equal to the first voltage VH, and the second gate voltage VLU has an increased level VL+V2 higher than the second voltage VL. Here, V2 may be represented by the product of an on-current and an on-resistance of the third N-type transistor Tn3. When the input signal has the second voltage VL, the first output switch Tn5 is turned off and the second output switch Tp5 is turned on. As a result, the second gate voltage VLU is selected, and the gate signal SG has a voltage level of VL+V2 when the input signal SI has the second voltage VL.

When the input signal SI has the first voltage VH, the first N-type transistor Tn1 is turned on and the third P-type transistor Tp3 is turned off. Accordingly, the first gate voltage VHD has a decreased level VH−V1 lower than the first voltage VH, and the second gate voltage VLU is equal to the second voltage VL. Here, V1 may be represented by the product of an on-current and an on-resistance of the first P-type transistor Tp1. When the input signal has the first voltage VH, the first output switch Tn5 is turned on and the second output switch Tp5 is turned off. As a result, the first second gate voltage VHD is selected, and the gate signal SG has a voltage level of VH−V1 when the input signal SI has the first voltage VH.

As such, the gate signal SG may transition in response to the transition timings of the input signal SI, and the gate signal SG may have the swing width VH−V1~VL+V2 less than the swing width VH~VH of the input signal SI. The bidirectional delay may be implemented and the delay amount of the transmission gate TG may be further increased using such gate signal SG.

Figure 28:
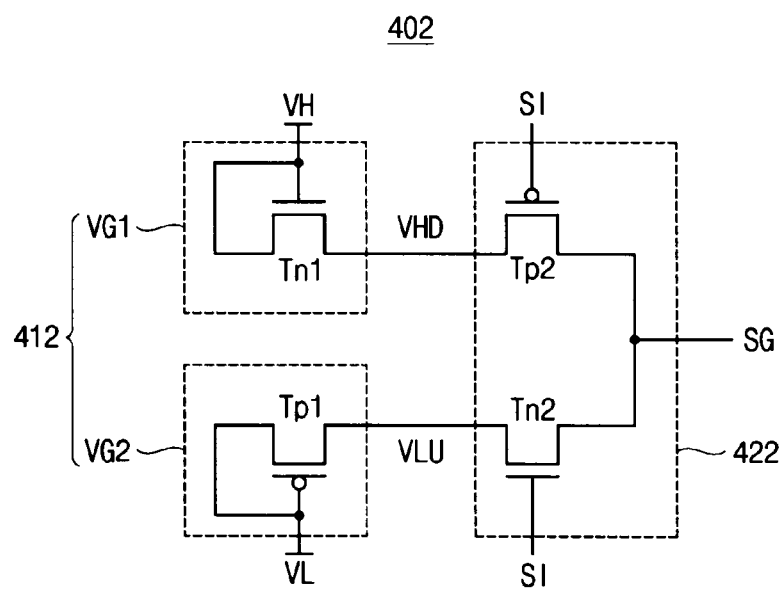
FIG. 28 is a circuit diagram illustrating an example embodiment of the gate signal generator of FIG. 24.
Figure 29:
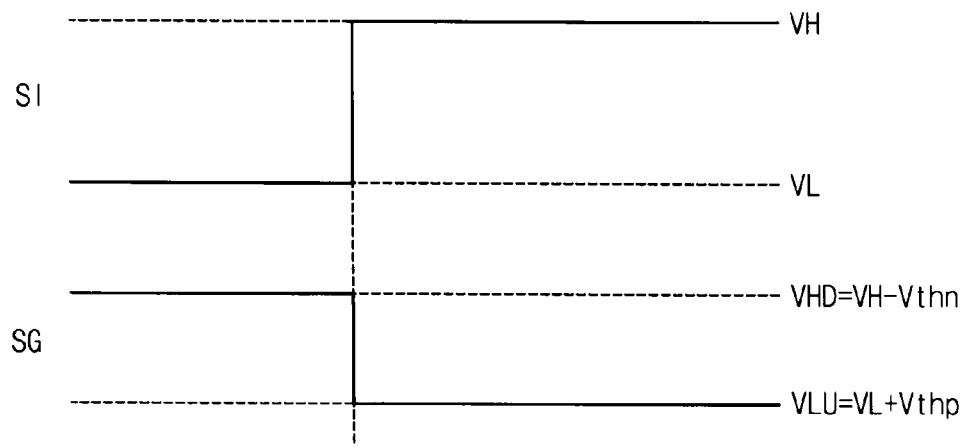
FIG. 29 is a timing diagram illustrating an example operation of the gate signal generator of FIG. 28.

FIG. 28 is a circuit diagram illustrating an example embodiment of the gate signal generator of FIG. 24, and FIG. 29 is a timing diagram illustrating an example operation of the gate signal generator of FIG. 28.

Referring to FIG. 28, a gate signal generator 402 may include a voltage generator 412 and an output switch circuit 422. The voltage generator 412 may include a first voltage generator VG1 and a second voltage generator VG2. Each of the first voltage generator VG1 and the second voltage generator VG2 may include one transistor. The first voltage generator VG1 may include a first N-type transistor Tn1 such that a gate electrode and a first electrode are connected to the first voltage VH, and the first gate voltage VHD is provided through a second electrode. The second voltage generator VG2 may include a first P-type transistor Tp1 such that a gate electrode and a first electrode are connected to the second voltage VL, and the second gate voltage VLU is provided through a second electrode. The first gate voltage VHD may have a voltage level of VH−Vthn that is lower than the first voltage VH by a threshold voltage Vthn of the first N-type transistor Tn1. The second gate voltage VLU may have a voltage level of VL+Vthp that is higher than the second voltage VL by a threshold voltage Vthp of the first P-type transistor Tp1.

The output switch circuit 422 may include a second P-type transistor Tp2 and a second N-type transistor Tn2. The second P-type transistor Tp2 may provide the first gate voltage VHD as the voltage level of the gate signal SG selectively in response to the input signal SI. The second N-type transistor Tn2 may provide the second gate voltage VLU as the voltage level of the gate signal SG selectively in response to the input signal SI.

Referring to FIG. 29, the input signal SI may transition between the first voltage VH and the second voltage VL. When the input signal SI has the second voltage VL, the second P-type transistor Tp2 is turned on, and the first gate voltage VHD may be selected as the voltage level of the gate signal SG. When the input signal SI has the first voltage VH, the second N-type transistor Tn2 is turned on, and the second gate voltage VLU may be selected as the voltage level of the gate signal SG.

As such, the gate signal SG may transition in response to the transition timings of the input signal SI, and the gate signal SG may have the swing width VH−Vthn~VL+Vthp less than the swing width VH~VH of the input signal SI. The bidirectional delay may be implemented, and the delay amount of the transmission gate TG may be further increased using such a gate signal SG.

Figure 30:
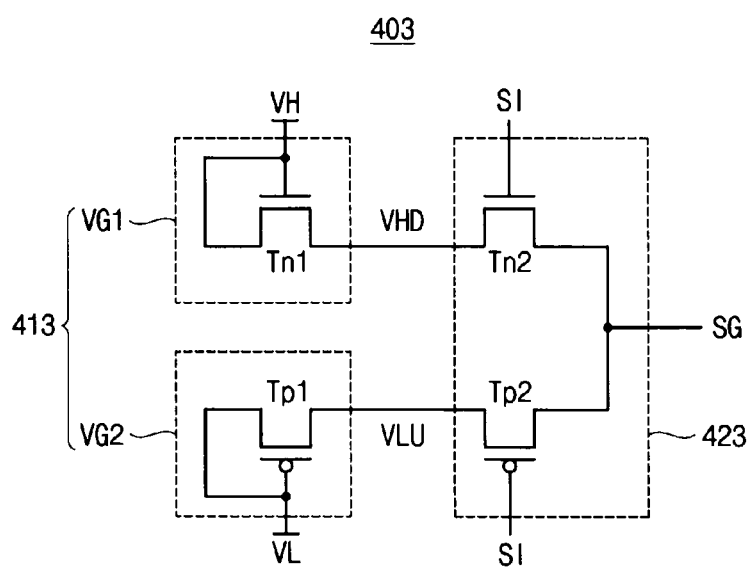
FIG. 30 is a circuit diagram illustrating an example embodiment of the gate signal generator of FIG. 24.
Figure 31:
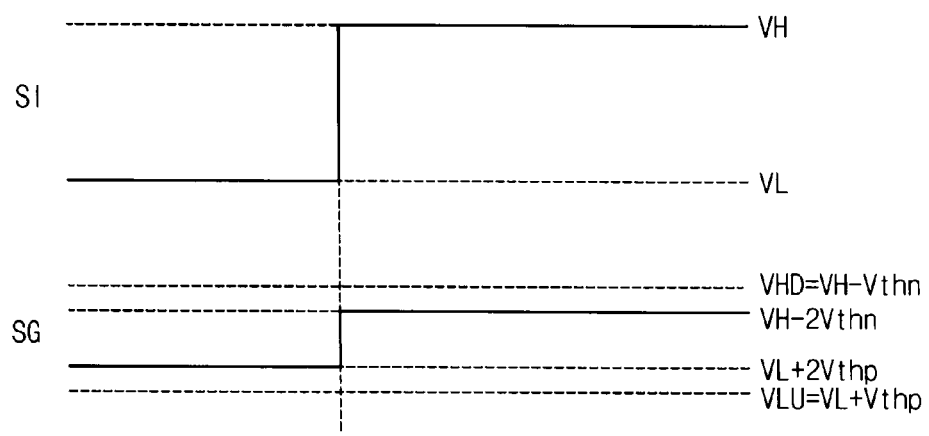
FIG. 31 is a timing diagram illustrating an example operation of the gate signal generator of FIG. 30.

FIG. 30 is a circuit diagram illustrating an example embodiment of the gate signal generator of FIG. 24, and FIG. 31 is a timing diagram illustrating an example operation of the gate signal generator of FIG. 30.

Referring to FIG. 30, a gate signal generator 403 may include a voltage generator 413 and an output switch circuit 423. The voltage generator 413 may include a first voltage generator VG1 and a second voltage generator VG2. Each of the first voltage generator VG1 and a second voltage generator VG2 may include one transistor. The first voltage generator VG1 may include a first N-type transistor Tn1 such that a gate electrode and a first electrode are connected to the first voltage VH and the first gate voltage VHD is provided through a second electrode. The second voltage generator VG2 may include a first P-type transistor Tp1 such that a gate electrode and a first electrode are connected to the second voltage VL and the second gate voltage VLU is provided through a second electrode. The first gate voltage VHD may have a voltage level of VH−Vthn that is lower than the first voltage VH by a threshold voltage Vthn of the first N-type transistor Tn1. The second gate voltage VLU may have a voltage level of VL+Vthp that is higher than the second voltage VL by a threshold voltage Vthp of the first P-type transistor Tp1.

The output switch circuit 423 may include a second N-type transistor Tn2 and a second P-type transistor Tp2. The second N-type transistor Tn2 may provide the first gate voltage VHD as the voltage level of the gate signal SG selectively in response to the input signal SI. The second P-type transistor Tp2 may provide the second gate voltage VLU as the voltage level of the gate signal SG selectively in response to the input signal SI.

Referring to FIG. 31, the input signal SI may transition between the first voltage VH and the second voltage VL. When the input signal SI has the second voltage VL, the second P-type transistor Tp2 is turned on and the second gate voltage VLU may be selected as the voltage level of the gate signal SG. When the input signal SI has the first voltage VH, the second N-type transistor Tn2 is turned on and the first gate voltage VHD may be selected as the voltage level of the gate signal SG.

As such, the gate signal SG may transition in response to the transition timings of the input signal SI and the gate signal SG may have the swing width VH−2Vthn~VL+2Vthp less than the swing width VH~VH of the input signal SI. The bidirectional delay may be implemented and the delay amount of the transmission gate TG may be further increased using such gate signal SG.

Figure 32:
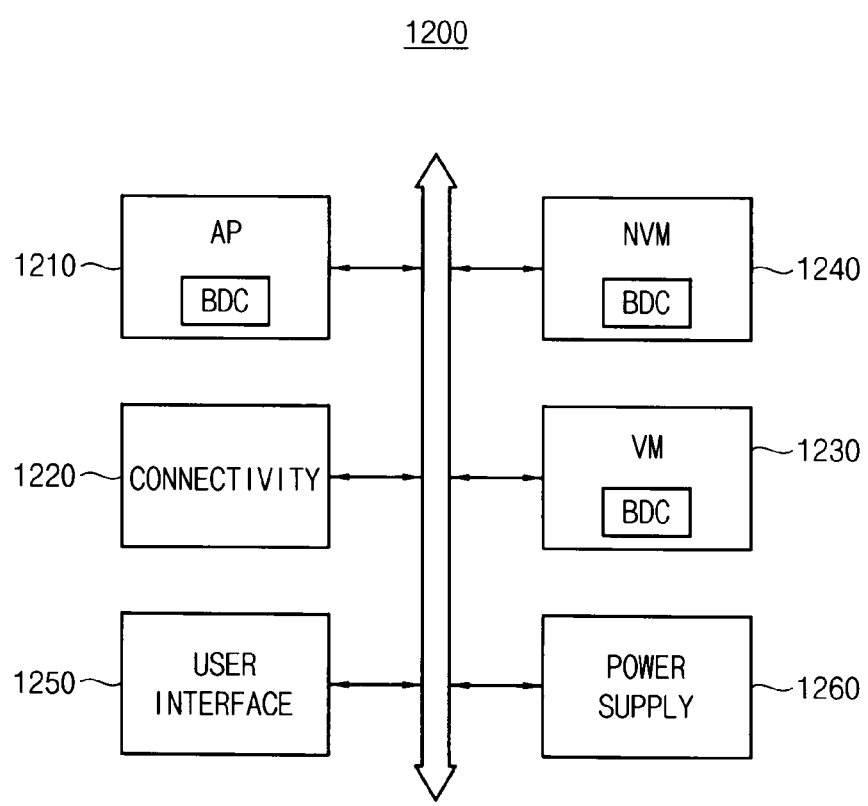
FIG. 32 is a block diagram illustrating a mobile system according to example embodiments.

FIG. 32 is a block diagram illustrating a mobile system according to example embodiments.

Referring to FIG. 32, a mobile system 1200 includes an application processor AP 1210, a connectivity unit 1220, a volatile memory device VM 1230, a nonvolatile memory device NVM 1240, a user interface 1250, and a power supply 1260. In some embodiments, the mobile system 1200 may be a mobile phone, a smart phone, a personal digital assistant (PDA), a portable multimedia player (PMP), a digital camera, a music player, a portable game console, a navigation system, or another type of electronic device.

The application processor 1210 may execute applications such as a web browser, a game application, a video player, etc. In some embodiments, the application processor 1210 may include a single core or multiple cores. For example, the application processor 1210 may be a multi-core processor such as a dual-core processor, a quad-core processor, a hexa-core processor, etc. The application processor 1210 may include an internal or external cache memory.

The connectivity unit 1220 may perform wired or wireless communication with an external device. For example, the connectivity unit 1220 may perform Ethernet communication, near field communication (NFC), radio frequency identification (RFID) communication, mobile telecommunication, memory card communication, universal serial bus (USB) communication, etc. In some embodiments, connectivity unit 1220 may include a baseband chipset that supports communications, such as global system for mobile communications (GSM), general packet radio service (GPRS), wideband code division multiple access (WCDMA), high speed downlink/uplink packet access (HSxPA), etc.

The volatile memory device 1230 may store data processed by the application processor 1210, or may operate as a working memory. For example, the volatile memory device 1230 may be a dynamic random access memory (DRAM), such as DDR SDRAM, LPDDR SDRAM, GDDR SDRAM, RDRAM, etc.

The nonvolatile memory device 1240 may store a boot image for booting the mobile system 1200. For example, the nonvolatile memory device 1240 may be an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), etc.

The application processor 1210, the volatile memory device 1230 and/or the volatile memory device 1240 may include a bidirectional delay circuit BDC. Even though not illustrated in FIG. 32, the other elements 1220, 1250 and 1260 may include the bidirectional delay circuit BDC. The bidirectional delay circuit BDC may include an input driving circuit and a delay switch circuit according to an example embodiment. The input driving circuit may be connected between an input node and an intermediate node, and the input driving circuit may amplify the input signal received through the input node to generate an intermediate signal through the intermediate node. The delay switch circuit may be connected between the intermediate node and a delay node, and the delay switch circuit may delay both of rising edges and falling edges of the intermediate signal in response to a gate signal to generate the delay signal through the delay node. The gate signal may transition in response to the input signal. Both of the rising edges and the falling edges of the input signal may be delayed using the gate signal transitioning in response to the input signal, thereby implementing a larger delay amount with a less circuit area.

The user interface 1250 may include at least one input device such as a keypad, a touch screen, etc., and at least one output device such as a speaker, a display device, etc. The power supply 1260 may supply a power supply voltage to the mobile system 1200. In some embodiments, the mobile system 1200 may further include a camera image processor (CIS), and/or a storage device, such as a memory card, a solid state drive (SSD), a hard disk drive (HDD), a CD-ROM, etc.

In some embodiments, the mobile system 1200 and/or components of the mobile system 1200 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi-chip package (MCP), wafer-level fabricated package (WFP), wafer-level processed stack package (WSP), etc.

Figure 33:
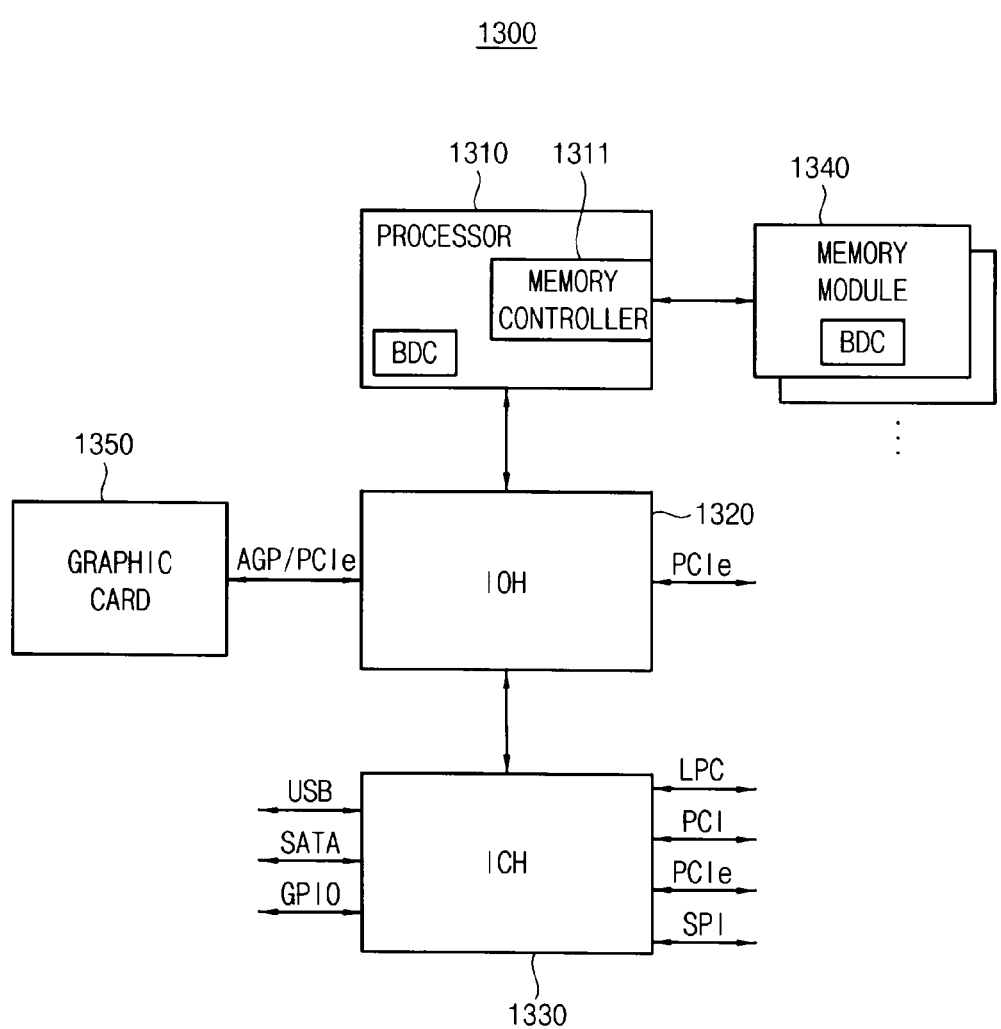
FIG. 33 is a block diagram illustrating a computing system according to example embodiments.

FIG. 33 is a block diagram illustrating a computing system according to example embodiments.

Referring to FIG. 33, a computing system 1300 includes a processor 1310, an input/output hub (IOH) 1320, an input/output controller hub (ICH) 1330, at least one memory module 1340, and a graphics card 1350. In some embodiments, the computing system 1300 may be a personal computer (PC), a server computer, a workstation, a laptop computer, a mobile phone, a smart phone, a personal digital assistant (PDA), a portable multimedia player (PMP), a digital camera, a digital television, a set-top box, a music player, a portable game console, a navigation system, etc.

The processor 1310 may perform various computing functions such as executing specific software for performing specific calculations or tasks. For example, the processor 1310 may be a microprocessor, a central process unit (CPU), a digital signal processor, or the like. In some embodiments, the processor 1310 may include a single core or multiple cores. For example, the processor 1310 may be a multi-core processor, such as a dual-core processor, a quad-core processor, a hexa-core processor, etc. Although FIG. 30 illustrates the computing system 1300 including one processor 1310 in some embodiments, the computing system 1300 may include a plurality of processors. The processor 1310 may include an internal or external cache memory.

The processor 1310 may include a memory controller 1311 for controlling operations of the memory module 1340. The memory controller 1311 included in the processor 1310 may be referred to as an integrated memory controller (IMC). A memory interface between the memory controller 1311 and the memory module 1340 may be implemented with a single channel including a plurality of signal lines, or may be implemented with multiple channels, to each of which at least one memory module 1340 may be coupled. In some embodiments, the memory controller 1311 may be located inside the input/output hub 1320, which may be referred to as a memory controller hub (MCH).

The processor 1310 and/or the memory devices in the memory modules 1340 may include a bidirectional delay circuit BDC. Even though not illustrated in FIG. 33, the other elements 1320, 1330 and 1350 may include the bidirectional delay circuit BDC. The bidirectional delay circuit BDC may include an input driving circuit and a delay switch circuit according to example embodiment. The input driving circuit may be connected between an input node and an intermediate node, and the input driving circuit may amplify the input signal received through the input node to generate an intermediate signal through the intermediate node. The delay switch circuit may be connected between the intermediate node and a delay node, and the delay switch circuit may delay both of rising edges and falling edges of the intermediate signal in response to a gate signal to generate the delay signal through the delay node. The gate signal may transition in response to the input signal. Both of the rising edges and the falling edges of the input signal may be delayed using the gate signal transitioning in response to the input signal, thereby implementing a larger delay amount with a less circuit area.

The input/output hub 1320 may manage data transfer between processor 1310 and devices, such as the graphics card 1350. The input/output hub 1320 may be coupled to the processor 1310 via various interfaces. For example, the interface between the processor 1310 and the input/output hub 1320 may be a front side bus (FSB), a system bus, a HyperTransport, a lightning data transport (LDT), a QuickPath interconnect (QPI), a common system interface (CSI), etc. Although FIG. 33 illustrates the computing system 1300 including one input/output hub 1320, in some embodiments, the computing system 1300 may include a plurality of input/output hubs. The input/output hub 1320 may provide various interfaces with the devices. For example, the input/output hub 1320 may provide an accelerated graphics port (AGP) interface, a peripheral component interface-express (PCIe), a communications streaming architecture (CSA) interface, etc.

The graphic card 1350 may be coupled to the input/output hub 1320 via AGP or PCIe. The graphics card 1350 may control a display device (not shown) for displaying an image. The graphics card 1350 may include an internal processor for processing image data and an internal memory device. In some embodiments, the input/output hub 1320 may include an internal graphics device along with or instead of the graphics card 1350 outside the graphics card 1350. The graphics device included in the input/output hub 1320 may be referred to as integrated graphics. Further, the input/output hub 1320 including the internal memory controller and the internal graphics device may be referred to as a graphics and a memory controller hub (GMCH).

The input/output controller hub 1330 may perform data buffering and interface arbitration to efficiently operate various system interfaces. The input/output controller hub 1330 may be coupled to the input/output hub 1320 via an internal bus, such as a direct media interface (DMI), a hub interface, an enterprise Southbridge interface (ESI), PCIe, etc. The input/output controller hub 1330 may provide various interfaces with peripheral devices. For example, the input/output controller hub 1330 may provide a universal serial bus (USB) port, a serial advanced technology attachment (SATA) port, a general purpose input/output (GPIO), a low pin count (LPC) bus, a serial peripheral interface (SPI), PCI, PCIe, etc.

In some embodiments, the processor 1310, the input/output hub 1320 and the input/output controller hub 1330 may be implemented as separate chipsets or separate integrated units. In other embodiments, at least two of the processor 1310, the input/output hub 1320 and the input/output controller hub 1330 may be implemented as a single chipset. Also, while many features of the embodiments are disclosed as units, in other embodiments, those features may be implemented as other forms of logic including but not limited to code-based operations performed by a processor.

As described above, the bidirectional delay circuit and the integrated circuit including the bidirectional delay circuit according to example embodiments may delay both of the rising edges and the falling edges of the input signal using the gate signal transitioning in response to the input signal, thereby implementing a larger delay amount with a less circuit area.

The present disclosure may be applied to arbitrary devices and systems requiring a delay in a signal. For example, the present disclosure may be applied to systems such as a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A bidirectional delay circuit comprising:
   an input driving circuit connected between an input node and an intermediate node, the input driving circuit configured to amplify an input signal received through the input node and to generate an intermediate signal through the intermediate node; and
   a delay switch circuit connected between the intermediate node and a delay node, the delay switch circuit configured to delay both of rising edges and falling edges of the intermediate signal in response to a gate signal and to generate a delay signal through the delay node, the gate signal transitioning in response to the input signal.

2. The bidirectional delay circuit of claim 1, wherein the delay switch circuit includes:
a P-type transistor connected between the intermediate node and the delay node, the P-type transistor including a P-type gate electrode receiving the gate signal; and
an N-type transistor connected between the intermediate node and the delay node, the N-type transistor including an N-type gate electrode receiving the gate signal.

3. The bidirectional delay circuit of claim 2, wherein, in response to a logic level of the gate signal, one of the P-type transistor and the N-type transistor is turned on and the other of the P-type transistor and the N-type transistor is turned off.

4. The bidirectional delay circuit of claim 2, wherein the P-type gate electrode and the N-type gate electrode are electrically connected to the input node through a conduction path.

5. The bidirectional delay circuit of claim 4, wherein the conduction path includes a gate poly that is formed and patterned together with the P-type gate electrode and the N-type gate electrode.

6. The bidirectional delay circuit of claim 2, wherein the P-type gate electrode and the N-type gate electrode are electrically connected to the intermediate node through a conduction path.

7. The bidirectional delay circuit of claim 1, wherein the input driver circuit includes one or more gate circuits that are connected in series between the input node and the intermediate node, and
the delay switch circuit includes one or more transmission gates that are connected in series between the intermediate node and the delay node, each transmission gate including a P-type gate electrode and an N-type gate electrode that receive the gate signal.

8. The bidirectional delay circuit of claim 7, wherein the gate circuits include at least one of an inverter, a buffer, an AND gate, an OR gate, a NAND gate, a NOR gate, an exclusive OR gate and an exclusive NOR gate.

9. The bidirectional delay circuit of claim 7, wherein, with respect to the one or more transmission gates, the P-type gate electrode and the N-type electrode are electrically connected to the input node.

10. The bidirectional delay circuit of claim 7, wherein, with respect to the one or more transmission gates, the P-type gate electrode and the N-type electrode are electrically connected to the intermediate node.

11. The bidirectional delay circuit of claim 1, further comprising an output driving circuit connected between the delay node and an output node, the output circuit configured to amplify the delay signal and to generate an output signal through the output node.

12. The bidirectional delay circuit of claim 1, further comprising a gate signal generator configured to be powered by a first voltage and a second voltage which is lower than the first voltage, and configured to generate the gate signal transitioning between a first gate voltage and a second gate voltage, the first gate voltage being lower than the first voltage, the second gate voltage being higher than the second voltage.

13. The bidirectional delay circuit of claim 12, wherein the gate signal generator includes:

a first voltage generator configured to generate the first gate voltage;
a second voltage generator configured to generate the second gate voltage; and
an output switch circuit configured to select one of the first gate voltage and the second gate voltage and to output the gate signal.

14. The bidirectional delay circuit of claim 13, wherein the first voltage generator includes a first P-type transistor, a second P-type transistor, a first N-type transistor and a second N-type transistor sequentially connected in series from the first voltage to the second voltage,
the second voltage is applied to gate electrodes of the first P-type transistor and the second P-type transistor,
the first gate voltage is provided through a connection node of the first P-type transistor and the second P-type transistor,
the input signal is applied to a gate electrode of the first N-type transistor, and
an enable signal is applied to a gate electrode of the second N-type transistor.

15. The bidirectional delay circuit of claim 14, wherein the second voltage generator includes a third N-type transistor, a fourth N-type transistor, a third P-type transistor and a fourth P-type transistor sequentially connected in series from the second voltage to the first voltage,
the first voltage is applied to gate electrodes of the third N-type transistor and the fourth N-type transistor,
the second gate voltage is provided through a connection node of the third N-type transistor and the fourth N-type transistor,
the input signal is applied to a gate electrode of the third P-type transistor, and
an inversion signal of the enable signal is applied to a gate electrode of the fourth P-type transistor.

16. The bidirectional delay circuit of claim 13, wherein the output switch circuit includes:
a first output switch configured to provide the first gate voltage as a voltage level of the gate signal according to the input signal; and
a second output switch configured to provide the second gate voltage as the voltage level of the gate signal according to the input signal.

17. An integrated circuit comprising:
a plurality of bidirectional delay circuits that are cascade-coupled, each of the plurality of bidirectional delay circuits configured to receive a delay signal from the bidirectional delay circuit of a previous stage as an input signal, each bidirectional delay circuit comprising:
an input driving circuit connected between an input node and an intermediate node, the input driving circuit configured to amplify the input signal received through the input node, and to generate an intermediate signal through the intermediate node; and
a delay switch circuit connected between the intermediate node and a delay node, the delay switch circuit configured to delay both of rising edges and falling edges of the intermediate signal in response to a gate signal, and to generate the delay signal through the delay node, the gate signal transitioning in response to the input signal.

18. The integrated circuit of claim 17, wherein the delay switch circuit includes:

a P-type transistor connected between the intermediate node and the delay node, the P-type transistor including a P-type gate electrode receiving the gate signal; and an N-type transistor connected between the intermediate node and the delay node, the N-type transistor including an N-type gate electrode receiving the gate signal.

19. The integrated circuit of claim 17, wherein the plurality of bidirectional delay circuits include:

a first bidirectional delay circuit configured to delay a first input signal in response to a first gate signal, and to generate a first delay signal; and a second bidirectional delay circuit configured to receive the first delay signal as a second input signal, to delay the second input signal in response to a second gate signal, and to generate a second delay signal, wherein the first bidirectional delay circuit receives an inversion signal of the first input signal as the first gate signal, and wherein the second bidirectional delay circuit receives the second input signal as the second gate signal.

20. A bidirectional delay circuit comprising:

an inverter connected between an input node and an intermediate node, the inverter configured to invert and amplify an input signal received through the input node, and to generate an intermediate signal through the intermediate node; and a transmission gate connected between the intermediate node and a delay node, the transmission gate configured to delay both of rising edges and falling edges of the intermediate signal in response to a gate signal, and to generate a delay signal through the delay node, the gate signal transitioning in response to the input signal.

* * * * *